United States Patent [19]

Ikeda

[11] Patent Number: 5,111,169
[45] Date of Patent: May 5, 1992

[54] LC NOISE FILTER

[76] Inventor: Takeshi Ikeda, 2-5-6-213, Sanno, Ohta-ku, Tokyo, Japan

[21] Appl. No.: 497,209

[22] Filed: Mar. 22, 1990

[30] Foreign Application Priority Data

Mar. 23, 1989 [JP] Japan .................................. 1-71339
May 12, 1989 [JP] Japan ................................. 1-119369

[51] Int. Cl.$^5$ ........................ H03H 7/01; H03H 7/09
[52] U.S. Cl. ................................. 333/181; 333/185; 336/200
[58] Field of Search ................ 333/181, 184, 185, 12, 333/177, 174, 204; 336/195, 199, 200, 232; 361/400, 401, 402

[56] References Cited

U.S. PATENT DOCUMENTS

| | | | |
|---|---|---|---|
| 1,563,731 | 12/1925 | Ducas | 336/200 |
| 2,583,854 | 1/1952 | Kehbel | 333/234 |
| 2,584,592 | 2/1952 | Kehbel | 336/200 X |
| 4,081,770 | 3/1978 | Mayer | 333/167 |
| 4,253,079 | 2/1981 | Brosh | 336/200 X |
| 4,313,151 | 1/1982 | Vranken | 336/232 X |
| 4,376,274 | 3/1983 | Smart | 336/232 X |
| 4,494,100 | 1/1985 | Stengel et al. | 336/200 |
| 4,614,925 | 9/1986 | Kane | 333/185 X |
| 4,728,911 | 3/1988 | Sjögren | 333/185 X |
| 4,843,404 | 6/1989 | Benge et al. | 333/185 X |

FOREIGN PATENT DOCUMENTS

| | | |
|---|---|---|
| 0214110 | 3/1987 | European Pat. Off. . |
| 52-97647 | 8/1977 | Japan . |
| 60-068708 | 4/1985 | Japan . |
| 61-164315 | 7/1986 | Japan . |
| 0053011 | 3/1987 | Japan .................................. 333/181 |
| 62-233911 | 10/1987 | Japan . |
| 1-030314 | 2/1989 | Japan . |

Primary Examiner—Eugene R. LaRoche
Assistant Examiner—Seung Ham
Attorney, Agent, or Firm—Oliff & Berridge

[57] ABSTRACT

An LC noise filter comprising a dielectric substrate, a plurality of concentrically adjacent spiral grooves provided in at least one surface of the substrate, and a plurality of inductor conductors provided in the respective spiral grooves. The inductor conductors are opposed to each other with the wall body between the grooves therebetween so as not to obstruct the magnetic path of the magnetic flux of the opposite inductor conductor. That is, a distribution constant LC noise filter having a sufficient capacitance and excellent electric characteristics without lowering the inductance of each inductor conductor is disclosed.

23 Claims, 22 Drawing Sheets

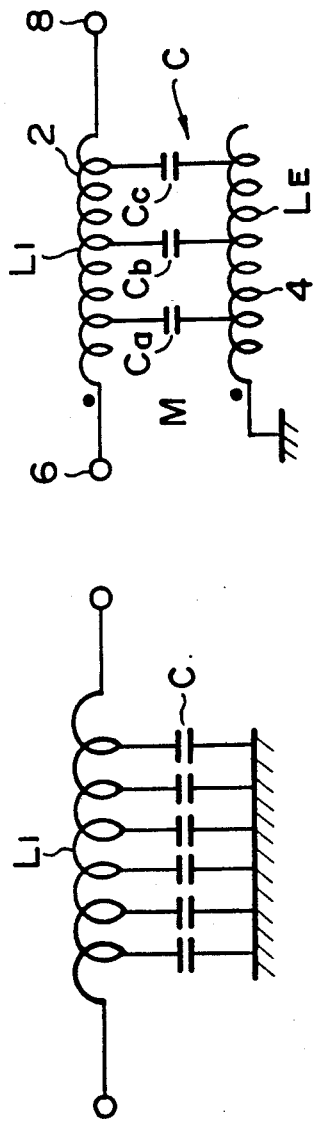

LC NOISE FILTER

BACKGROUND OF THE INVENTION

1. Field of the Invention

The present invention relates to the improvement of an LC noise filter provided on a dielectric.

2. Description of the Related Art

A noise filter produced by providing a spiral inductor conductor 2 on the surface 10a of a dielectric substrate 10 made of a ceramic material or the like, as shown in FIG. 30(A), and forming a grounding conductor 4 on the back surface 10b of the dielectric substrate 10, as shown in FIG. 30(B) is conventionally known.

Such a noise filter provides an inductance (L) by the spiral inductor conductor 2 and an electrostatic capacitance (C) between the inductor conductor 2 and the grounding conductor 4 in the form of a distribution constant, as shown in FIG. 31 and functions as an LC noise filter.

The conventional LC noise filter, however, has the following problems.

(a) First problem

The conventional LC noise filter generates an eddy current on the grounding conductor 4 provided on the back side of the substrate 10. For this reason, the inductance provided by the spiral inductor conductor 2 is not as large as expected, and the electric characteristic obtained are not those produced by an LC noise filter but rather resemble those produced by a capacitor.

More specifically, in this LC noise filter, the grounding conductor 4 not only capacitively couples with the spiral inductor conductor 2 by electrostatic capacitance, but also inductively couples therewith. Therefore, the magnetic flux produced by the energizing current of the spiral inductor conductor 2 also produces an electromotive force on the grounding conductor 4, and a short-circuit current flows as indicated by the solid line A in FIG. 30(B) due to the electromotive force.

If the spiral inductor conductor 2 is compared to a primary coil in a transformer, the grounding conductor 4 acts like a secondary coil, so that it is impossible to obtain as large an inductance as expected from the spiral inductor conductor 2. In other words, such a conventional noise filter cannot display full function as an LC noise filter.

(b) Second problem

The noise filter removes the noise contained in a signal supplied to electrodes 6 and 8 on both ends of the inductor conductor 2. However, if the frequency of the signal supplied is high, a short circuit between lines such as those indicated by the arrow B is caused on the spirally wound inductor conductor 2, as shown in FIG. 30(A), thereby lowering the function of the inductor conductor 2 as an inductor.

The higher the frequency of the signal supplied, the more frequently such a short circuit between lines is caused. The conventional noise filter is therefore not suitable, especially as a high-frequency noise filter.

(c) Third problem

This noise filter does not produce such a large capacitance C as expected between the inductor conductor 2 provided on the surface of the substrate 10 and the grounding conductor 4 provided on the back side of the substrate 10, and the electric characteristics obtained are inferior to those of a lumped constant LC noise filter.

When the frequency of the signal supplied to the inductor conductor 2 becomes high, the inductance of the inductor conductor 2 changes so that the capacitance C between the inductor conductor 2 and the grounding conductor 4 becomes even smaller. Thus, this noise filter cannot fully function as an LC noise filter.

SUMMARY OF THE INVENTION

It is an object of the present invention to eliminate the above-described problems in the related art and to provide an LC noise filter having excellent electric characteristics.

To achieve this aim, the present invention provides an LC noise filter comprising:

a plurality of spiral grooves formed in at least one surface of a dielectric material in such a manner as to be concentrically adjacent to each other;

a plurality of inductor conductors each of which is provided in each of the plurality of grooves, each of the inductor conductors constituting a capacitor between the inductor conductor adjacent thereto and a wall body of the dielectric material therebetween.

The present invention also provides an LC noise filter comprising:

a spiral groove formed in at least one surface of a dielectric material at least one ground groove provided on at least one surface of the dielectric material in such a manner as to be adjacent to a part of the spiral groove;

an inductor conductor provided in the spiral groove; and a grounding block conductor provided in the ground groove;

the inductor conductor constituting a capacitor with the block conductor adjacent thereto and a wall body of the dielectric material therebetween.

The operation of the present invention will now be explained.

The present inventor analyzed the reasons why the capacitance C obtained between the inductor conductor 2 and the grounding conductor 4 of the LC noise filter, for example, shown in FIG. 30 is not as large as expected. On the hypothesis that the main cause thereof lies in the short-circuit current flowing in the grounding conductor 4, whether the inductance $L_1$ and the capacitance C of the LC noise filter shown in FIG. 31 actually function or not was examined.

(a) Examination on the inductance

The inductance on the inductor conductor 2 was first examined.

In the LC noise filter, the grounding conductor 4 not only capacitively couples with the spiral inductor conductor 2 by electrostatic capacitance, but also inductively couples therewith, as described above. Therefore, a mutual inductance M with the grounding conductor 4 as well as the self inductance $L_1$ acts on the inductor conductor 2. It is considered that especially, if the area of the grounding conductor 4 is large as in the related art, the mutual inductance M is too large for the inductor conductor 2 to display full function as an LC noise filter.

In addition, since the conventional grounding conductor 4 on the surface of the substrate 10 faces the total surface of the spiral inductor conductor 2, the magnetic path of the inductor conductor 2 is blocked, thereby increasing the magnetic resistance thereof. Thus, the large inductance expected cannot be obtained from the inductor conductor 2, which is the main cause of lowering the function of the noise filter.

(b) Examination on the capacitance

The reason why such a large capacitance C as expected cannot be obtained between the inductor conductor 2 and the grounding conductor 4 was next examined.

If the spiral inductor conductor 2 is compared to a primary coil in a transformer, the grounding conductor 4 acts like a short-circuitted secondary coil, and the inductance component of the grounding conductor 4 increases to a greater extent than imagined in spite of being formed on the flat surface. Therefore, the accurate equivalent circuit diagram of the conventional LC noise filter actually becomes not the one such as that shown in FIG. 31 but the one such as that shown in FIG. 32. In FIG. 32, the symbol $L_1$ represents the inductance of the inductor conductor 2, $L_E$ the inductance of the grounding conductor 4, and C the capacitance formed between the two conductors 2 and 4 in the form of a distribution constant.

The capacitance C is now divided into the capacitances of three concentrated capacitors $C_a$, $C_b$ and $C_c$ for convenience' sake. If the inductance $L_E$ of the grounding conductor 4 increases, the conduction either to the capacitors $C_b$ or $C_c$, which is distant from a ground terminal 28 is blocked by the inductance $L_E$. Therefore, only the capacitance of the capacitor $C_a$ which is close to the ground terminal 28 acts as the capacitance of the noise filter.

Thus, the conventional LC noise filter can provide only the capacitance of the capacitor Ca as a filter and the capacitance C expected from the structure thereof cannot be obtained. Even if the area of the grounding conductor 4 shown in FIG. 31(B) is reduced to ½ or ⅓, the substantial characteristic as a noise filter scarcely varies, and it is difficult to produce an LC noise filter having a desired capacitance.

As is clear from the investigations (a) and (b) explained above, the conventional LC noise filter cannot produce a sufficient capacitance as a whole circuit, i.e. the characteristics obtained are inferior to those of a lumped constant LC noise filter.

(c) Invention

In view of these facts, the way of providing a grounding conductor which functions as a capacitor on a dielectric substrate with respect to the inductor conductor spirally formed on a surface of the dielectric material was investigated in order to produce an LC noise filter having good characteristics.

On the assumption that if the grounding conductor is formed in such a manner as not to block the magnetic path of the magnetic flux produced when the spiral inductor conductor is energized, an LC noise filter having good electric characteristics is obtained without lowering the inductance of the inductor conductor, by providing a plurality of concentrically adjacent spiral grooves on at least one surface of a dielectric, material and the inductor conductor was provided in each groove, thereby producing an LC noise filter.

The inductor conductor provided in each groove faces the adjacent inductor conductor with a wall body between the spiral grooves and forms a capacitor. It is therefore possible to obtain the optimum capacitance by appropriately selecting the material of the dielectric material.

In the present invention, since there is no conductor on the dielectric material which blocks the magnetic path of each inductor conductor, each inductor conductor has sufficient inductance.

The present inventor formed a spiral groove on at least one surface of a dielectric material, and at least one ground groove was provided substantially adjacent to a part of the spiral groove, as described below. An inductor conductor was provided in the spiral groove and a grounding block conductor was provided in the ground groove.

Since the grounding block conductor has a small area, the self inductance $L_E$ is small and it is possible to use the capacitance formed between the grounding block conductor and the inductor conductor as the capacitance of the noise filter as it is.

Furthermore, since the grounding block conductor faces only a part of the inductor conductor, the mutual inductance between the inductor conductor and the grounding block conductor is substantially negligible, so that it is possible to produce an LC noise filter which does not contain the mutual inductance that lowers the characteristics of the noise filter.

In addition, since the grounding block conductor, which only faces a part of the inductor conductor, does not block the magnetic path of the inductor conductor, the inductance of the inductor conductor is not lowered.

Thus, according to the present invention, it is possible to provide an LC noise filter which has sufficient L and C, and a small mutual inductance that exerts deleterious influence on the characteristics. When this LC noise filter was used, the characteristics much better than those of the conventional LC noise filter shown in FIG. 30 were obtained with the provision of only one grounding block conductor. When a plurality of grounding block conductors were provided, each block conductor individually constituted a capacitor which effectively functioned with the inductor conductor. Therefore, it is possible to obtain an LC noise filter having a desired capacitance by providing a given number of grounding block conductors.

Furthermore, according to the present invention, it is possible to obtain the characteristics of an LC noise filter approximate to those of the distribution constant type which cannot be obtained by the conventional filter by providing a plurality of grounding block conductors.

As a result of further researches, it has been found that the position at which the grounding block conductor was faced to the inductor conductor greatly influences the attenuation characteristic of the noise filter, and that an excellent attenuation characteristic was obtained by disposing the grounding block conductor close to the input or output terminal of the inductor conductor in the electric circuit.

Therefore, when one grounding block conductor is provided, it is disposed in proximity to either the input terminal or the output terminal of the inductor conductor.

When a plurality of grounding block conductors are provided, one is disposed in proximity to the input terminal of the inductor conductor, another in proximity to the output terminal of the inductor conductor, and the others at other positions.

In the present invention, a spiral groove is formed on at least one surface of the dielectric material and at least one grounding block conductor is provided adjacently to a part of the spiral groove. In this structure, the inductor conductor and the grounding block conductor provided in each groove faces each other with the wall body between the grooves, and constitutes a larger capacitor. It is therefore possible to obtain the optimum capacitance by appropriately selecting the material of the dielectric material, the size and the width of the wall body, etc.

In addition, according to the present invention, since the lines of the inductor conductors, and the inductor conductor and the grounding block conductor are completely isolated from each other through the wall body between the grooves, the inductor conductor sufficiently functions as an inductor without causing short circuit between the lines even in a high-frequency zone as in a conventional noise filter.

According to the present invention, it is possible to provide a plurality of grounding block conductors intermittently between the lines of the inductor conductors so as to function as a shield conductor which prevents short circuit between lines, thereby ensuring safer prevention of the short circuit between the lines of the inductor conductors.

Thus, according to the present invention, it is possible to product an LC noise filter having excellent electric characteristics in a wide region ranging from a low-frequency zone to a high-frequency zone.

The above and other objects, features and advantages of the present invention will become clear from the following description of the preferred embodiments thereof, taken in conjunction with the accompanying drawings.

BRIEF DESCRIPTION OF THE DRAWINGS

FIGS. 1 to 4 are explanatory views of first and second embodiments of the present invention; wherein FIGS. 1 (A) to 1(C) are explanatory views of an example of a substrate used in these embodiments;

FIG. 4 is an explanatory view of inductor conductors which face each other with the wall body therebetween;

FIGS. 8 to 15 are explanatory views of a fourth embodiment of the present invention; wherein FIG. 8 is an explanatory view of an example of a substrate used in this embodiment;

FIG. 9 is a schematic explanatory view of a through hole provided in each groove of the substrate shown in FIG. 8;

FIGS. 10(A) and 10(B) are explanatory views of a normal mode LC noise filter of this embodiment in which conductors are provided in grooves, wherein FIG. 10(A) is a schematic explanatory view of the surface thereof, and FIG. 10(B) is a schematic explanatory view of the back surface thereof;

FIG. 11 is a sectional perspective view of the noise filter shown in FIG. 10(A), taken along the line XI—XI;

FIG. 12 is the equivalent circuit diagram of the noise filter of the fourth embodiment;

FIG. 13 is an explanatory view of the inductor conductor and the grounding block conductor which are opposed to each other with the wall body of the substrate therebetween;

FIG. 14 is an explanatory view of another example of a spiral groove and a ground groove provided on the substrate, which are tapered toward the outside;

FIG. 15 is a sectional perspective view of a modification of an LC noise filter of the fourth embodiment, which has shallow type grooves;

FIGS. 16 to 18 are explanatory views of a fifth embodiment of the present invention, wherein FIG. 16(A) is an explanatory view of the surface of a normal mode LC noise filter of this embodiment, FIG. 16(B) is an explanatory view of the back surface thereof, FIG. 17 is a sectional perspective view of the noise filter shown in FIG. 16(A), taken along the line X—X; and FIG. 18 is the equivalent circuit diagram of the noise filter of the fifth embodiment;

FIGS. 31 and 32 are the equivalent circuit diagrams of the conventional noise filter shown in FIG. 30.

DESCRIPTION OF THE PREFERRED EMBODIMENTS

Preferred embodiments of the present invention will be explained in detail with reference to the accompanying drawings.

First Embodiment

A first embodiment of an LC noise filter according to the present invention, which is provided as a normal mode LC noise filter, will first be explained.

Figure 1A:
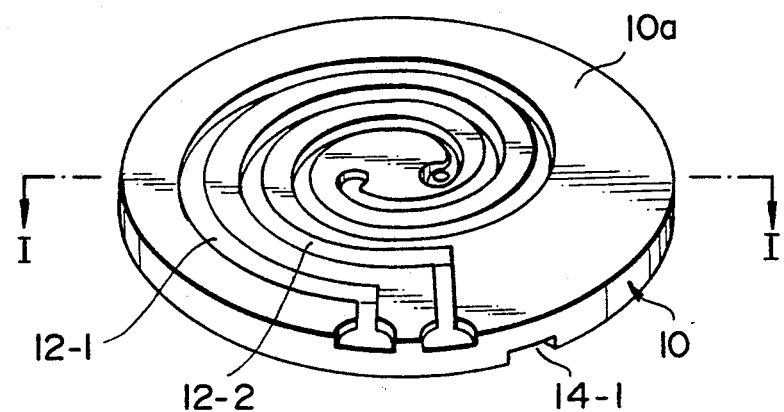
Figure 1B:
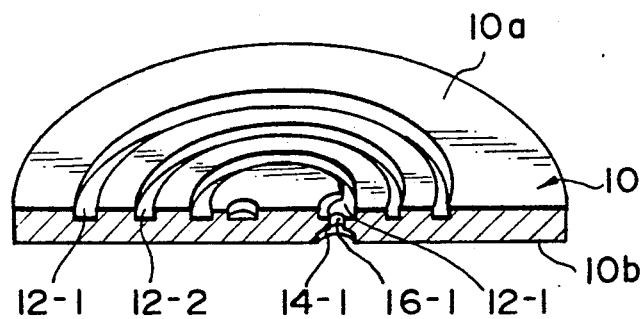
Figure 1C:
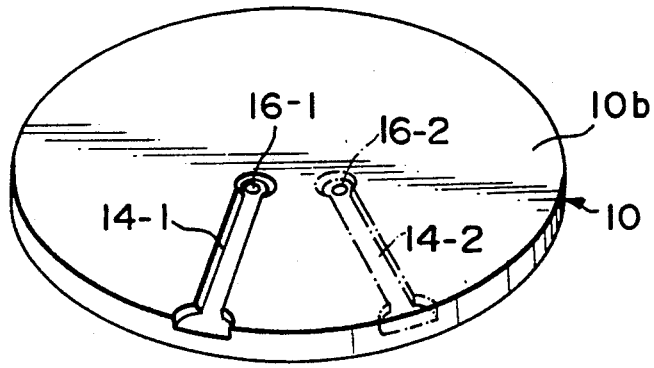

The LC noise filter of this embodiment is composed of a dielectric substrate 10 of a ceramic material or the like, two concentrically adjacent spiral grooves 12-1, 12-2 provided on the surface 10a of the substrate 10, as shown in FIG. 1(A), and a groove 14-1 provided on the back surface 10b in such a manner as to extend from the center of the back surface 10b to the periphery, as shown in FIG. 1(C). Proximate to the center of the substrate 10, the inner end portions of the spiral groove 12-1 and the groove 14-1 communicate with each other through a through hole 16-1, as shown in FIG. 1(B).

Figure 2A:
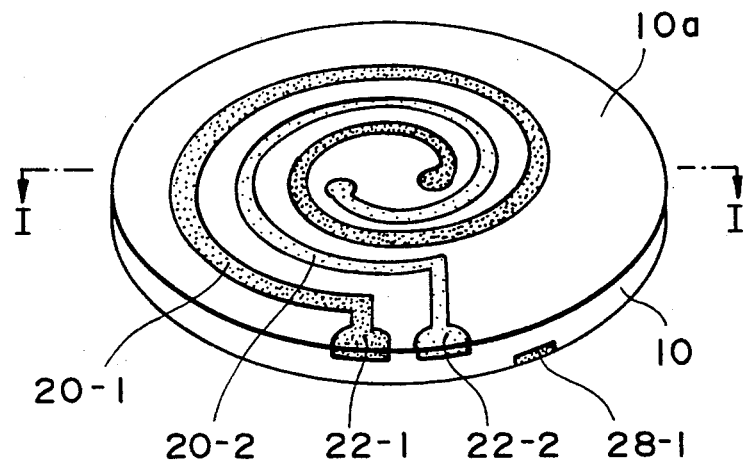
FIGS. 2(A) to 2(C) are explanatory views of a normal mode LC noise filter of the first embodiment and a common mode LC noise filter of the second embodiment produced by providing conductors in the grooves shown in FIGS. 1(A) to 1(C)

As shown in FIG. 2(A), first and second inductor conductors 20-1, 20-2 are provided in the spiral grooves 12-1, 12-2, respectively, provided on the surface 10a of the substrate 10, and the outer end portions of the inductor conductors 20-1, 20-2 are connected to terminals 22-1, 22-2, respectively.

Figure 2B:
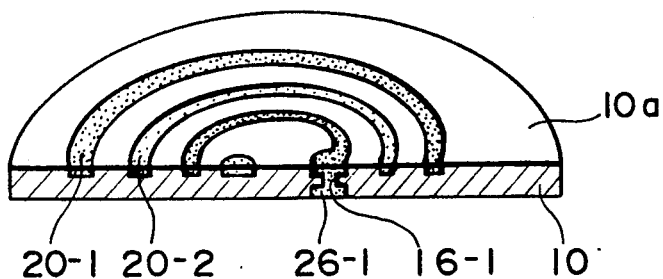
Figure 2C:
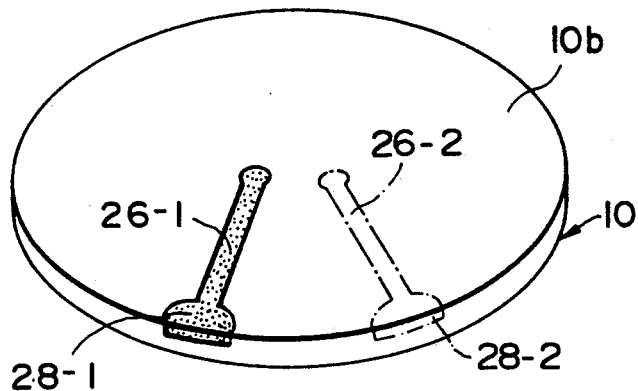

As shown in FIG. 2(C), the groove 14-1 provided on the back side of the substrate 10 is provided with a lead 26-1, the outer end portion of the lead 26-1 being connected to a terminal 28-1 and the inner end portion thereof being electrically connected to the inner end portion of the first inductor conductor 20-1 through the through hole 16-1, as shown in FIG. 2(B).

These conductors 20-1, 20-2, 26-1 are easily produced by applying a resist to the substrate 10 in advance except for the grooves 12-1, 12-2 and 14-1, and dipping the substrate 10 in a conductive tank which is filled with a liquid conductor.

The conductors 20-1, 20-2, 26-1 are also easily produced by dipping the substrate 10 without the application of a resist, and grinding the surfaces of the substrate 10 so as to remove the conductor which has adhered to the portions other than the grooves 12-1, 12-2 and 14-1.

A method other than dipping may be adopted to provide the conductors in the corresponding grooves. For example, the substrate 10 may be plated with a conductor.

Figure 3A:
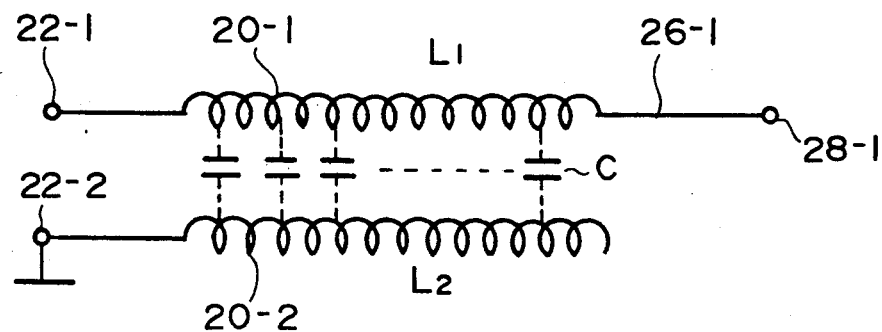
FIGS. 3(A) and 3(B) are the equivalent circuit diagrams of the first embodiment and the second embodiment, respectively.

FIG. 3(A) is the equivalent circuit diagram of the LC noise filter of this embodiment. In this embodiment, the terminals 22-1, 28-1 are used as the input and output terminals, and the terminal 22-2 is used as the ground terminal.

The first inductor conductor 20-1 connected to the input and output terminals 22-1, 28-1 provides a first inductance $L_1$ and the second inductor conductor 20-2 connected to the ground terminal 22-2 provides a second inductance $L_2$.

Figure 4:
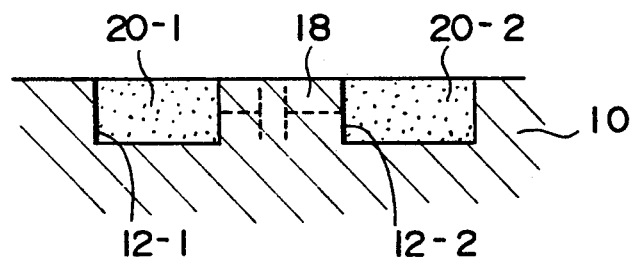

The first and second inductor conductors 20-1, 20-2 face each other with the wall body 18 between the grooves 12-1, 12-2 therebetween, as shown in FIG. 4. Therefore, the first and second inductor conductors 20-1, 20-2 capacitively couple with each other by electrostatic capacitance, and the capacitance C is formed therebetween in the form of a distribution constant. Therefore, by using a material having a high dielectric constant for the substrate 10, it is possible to set the capacitance C at a large value, if necessary.

In this way, the noise filter of this embodiment functions as a distribution constant LC noise filter having the circuit structure shown in FIG. 3(A).

In this noise filter, the second inductor conductor 20-2, which constitutes a capacitor with the first inductor conductor 20-1, is provided in such a manner as not to block the magnetic path of the first inductor conductor 20-1.

The magnetic flux generated when the first inductor conductor 20-1 is energized passes the wall body 18 between the grooves 12-1, 12-2 from the surface side of the substrate 10 to the back side, or in the reverse direction. If the inductor conductor 20-2 is provided in such a manner as to block the magnetic path (e.g., if the inductor conductor 20-2 is provided in such a manner as to cover the surface of the wall body 18), the magnetic path is blocked by the inductor conductor 20-2 and the first inductor conductor 20-1 cannot sufficiently function as an inductor.

In contrast, in the present invention, shown in FIG. 4, since the second inductor conductor 20-1 is provided concentrically adjacently to the first inductor conductor 20-1, the magnetic path of the first inductor conductor 20-1 is not blocked by the second inductor conductor 20-2 at all, and the effect of the LC noise filter is fully displayed without reducing the inductance of the spiral first inductor conductor 20-1.

In addition, in this embodiment, since the second inductor conductor 20-2, which is used as a grounding conductor, is spirally provided between the lines of the first inductor conductor 20-1, which is used as an energizing conductor, the second inductor conductor 20-2 functions as a shield conductor with respect to the first inductor conductor 20-1.

Accordingly, the noise filter of this embodiment solves not only the first problem but also the second problem and also functions as a normal mode noise filter having excellent electric characteristics in a wide region ranging from a low-frequency zone to a high-frequency zone.

Furthermore, in this embodiment, the conductors 20-1, 20-2, 26-1 are provided in the grooves 12-1, 12-2 and 14-1, respectively, each conductor is allowed to have a larger sectional area in comparison with the related art in which each conductor is so formed as to coat the surface of the substrate 10. The LC noise filter of this embodiment is therefore very suitable as an LC noise filter for the power source or a comparatively large energizing current.

Second Embodiment

A second embodiment of an LC noise filter according to the present invention, which is applied to a common mode noise filter, will be explained.

This embodiment is characterized in that a groove 14-2 is provided on the back surface 10b of the substrate 10 shown in FIGS. 1 and 2, as indicated by the one-dot chain line in FIG. 1(C) and in that a second lead 26-2 which is electrically connected to the inner end portion of the second inductor conductor 20-2 through a through hole 16-2 is provided in the groove 14-2.

Since the other structure is the same as that of the first embodiment, the same numerals are provided for the elements which are the same as those in the first embodiment and explanation thereof will be omitted.

Figure 3B:
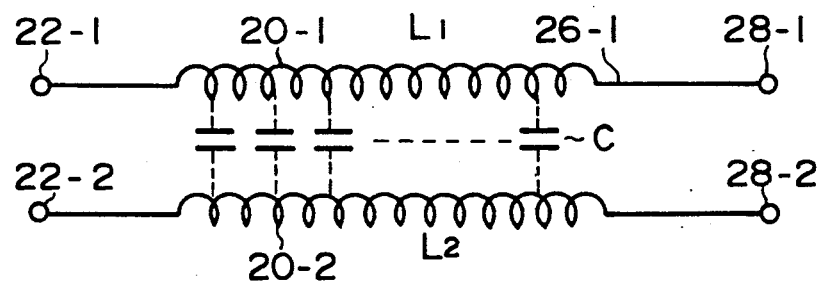

FIG. 3(B) is the equivalent circuit diagram of the LC noise filter of this embodiment. In this embodiment, both ends of the first inductor conductor 20-1 and the second inductor conductor 20-2 are connected to the input and output terminals 22-1, 28-1 and 22-2, 28-2, respectively, so that the LC noise filter functions as a common mode four-terminal LC noise filter.

Third Embodiment

A preferred embodiment of an LC noise filter using a shield conductor will now be explained.

Figure 5A:
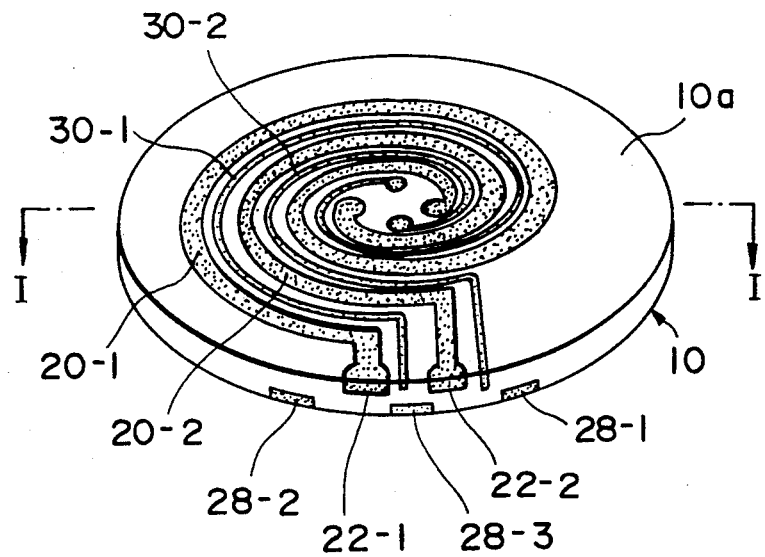
FIGS. 5(A) to 5(C) are explanatory views of a third embodiment of the present invention, which is a common mode LC noise filter.

FIG. 5 shows a third embodiment of an LC noise filter.

Figure 5B:
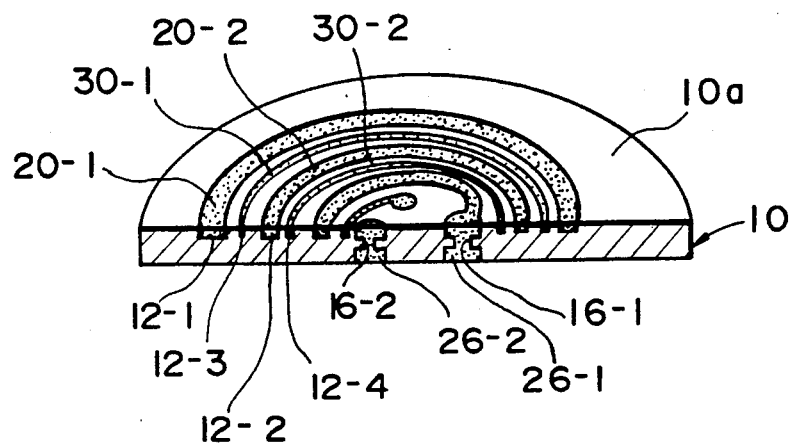
Figure 5C:
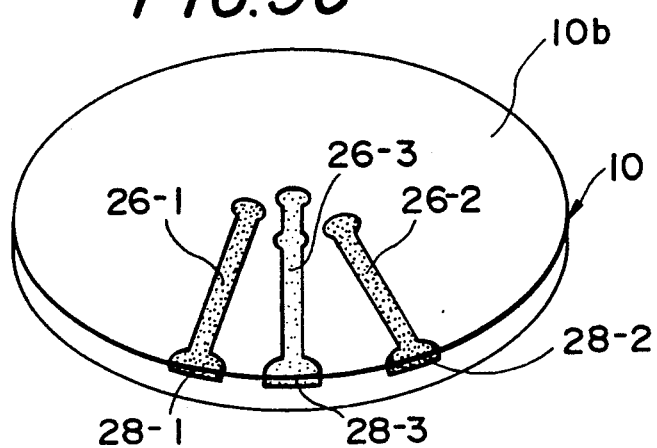

In this embodiment, the first and second inductor conductors 20-1, 20-2 are provided on the surface 10a of the substrate 10 in the same way as in the first embodiment. On the back surface 10b of the substrate 10, the first lead 26-1 and the second lead 26-2 are provided, as shown in FIG. 5(C). The inner end portions of the first inductor conductor 20-1 and the first lead 26-1 are electrically connected to each other through the through hole 16-1, as shown in FIG. 5(B), and the inner end portions of the second inductor conductor 20-2 and the second lead 26-2 are also electrically connected to each other through the through hole 16-2. Thus, this noise filter functions as a common mode four-terminal LC noise filter.

A common mode noise filter in which the first and second inductor conductors 20-1, 20-2 are used as energizing conductors involves a possibility of causing short circuit between lines of both conductors if an energizing frequency becomes high.

The third embodiment is characterized in that a first shield conductor 30-1 for isolating both conductors is spirally formed between the inductor conductors 20-1 and 20-2, and that a second shield conductor 30-2 is spirally formed between the inductor conductors 20-2 and 20-1 in order to prevent the short circuit between lines more effectively.

The shield conductors 30-1, 30-2 may be provided in such a manner as to coat the surface 10a of the substrate 10, but in this embodiment, they are provided in spiral grooves 12-3 and 12-4 in the same way as the inductor conductors 20-1, 20-2. On the back side of the substrate 10, a ground lead 26-3 having a ground terminal 28-3 at the outer end portion is provided, and the inner end portion of the ground lead 26-3 is electrically connected to the inner end portions of the first and second shield conductors 30-1, 30-2 through a through hole (not shown).

Figure 6:
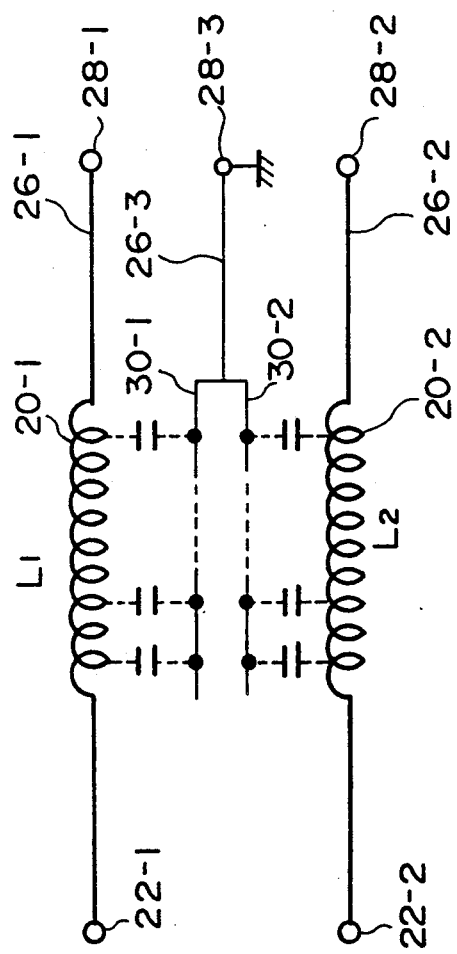
FIG. 6 is the equivalent circuit diagram of the third embodiment.
Figure 7:
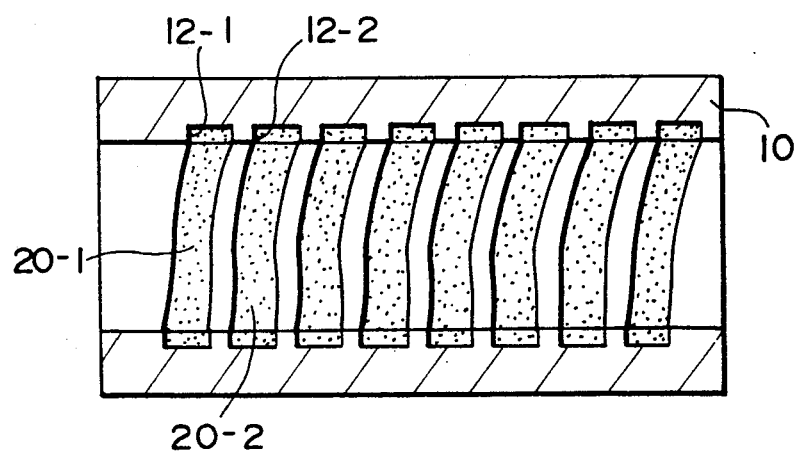
FIG. 7 is an explanatory view of a modification of a dielectric used in the present invention.

In this way, the LC noise filter of this embodiment functions as a common mode four-terminal LC noise filter. FIG. 6 is the equivalent circuit diagram of this embodiment. The shield conductors 30-1, 30-2 can effectively prevent the short circuit between the lines of the inductor conductors 20-1 and 20-2, thereby solving not only the first problem but also the second problem and also functioning as a noise filter having excellent electric characteristics in a wide region ranging from a low-frequency region to a high-frequency region.

In the first to third embodiments, inductor conductors are only provided on a single surface of the substrate 10, but inductor conductors may be spirally provided on both sides of the substrate 10 in such a manner as to be opposed to each other with the substrate 10 therebetween, if necessary. In this case, it is possible to produce a noise filter having a large inductance by electrically connecting the inductor conductors on both sides of the substrate 10.

As explained above, according to these embodiments, by adopting a novel structure in which a plurality of concentrically adjacent spiral grooves are provided in at least one surface of a dielectric material and an inductor conductor is provided in each groove, each inductor conductor is situated at a position which does not check the magnetic path of the magnetic flux of the opposite inductor conductor and faces the opposite inductor conductor with the wall body between the spiral grooves. Thus, it is possible to produce a distribution constant LC noise filter having a sufficient capacitance and excellent electric characteristics without lowering the inductance of each inductor conductor.

According to the first embodiment, the grounding inductor conductor functions as a shield conductor for preventing a short circuit between the lines of the energizing inductor conductor, thereby making it possible to produce a normal mode LC noise filter which is capable of removing the noise component without causing a short circuit between lines even in a high-frequency zone.

According to the third embodiment, by providing the first and second shield conductors for preventing short circuit between lines between the first and second inductor conductors which are used as energizing conductors, it is possible to produce a common mode LC noise filter which is capable of removing the noise component without causing a short circuit between lines even in a high-frequency zone.

Fourth Embodiment

Figure 8:
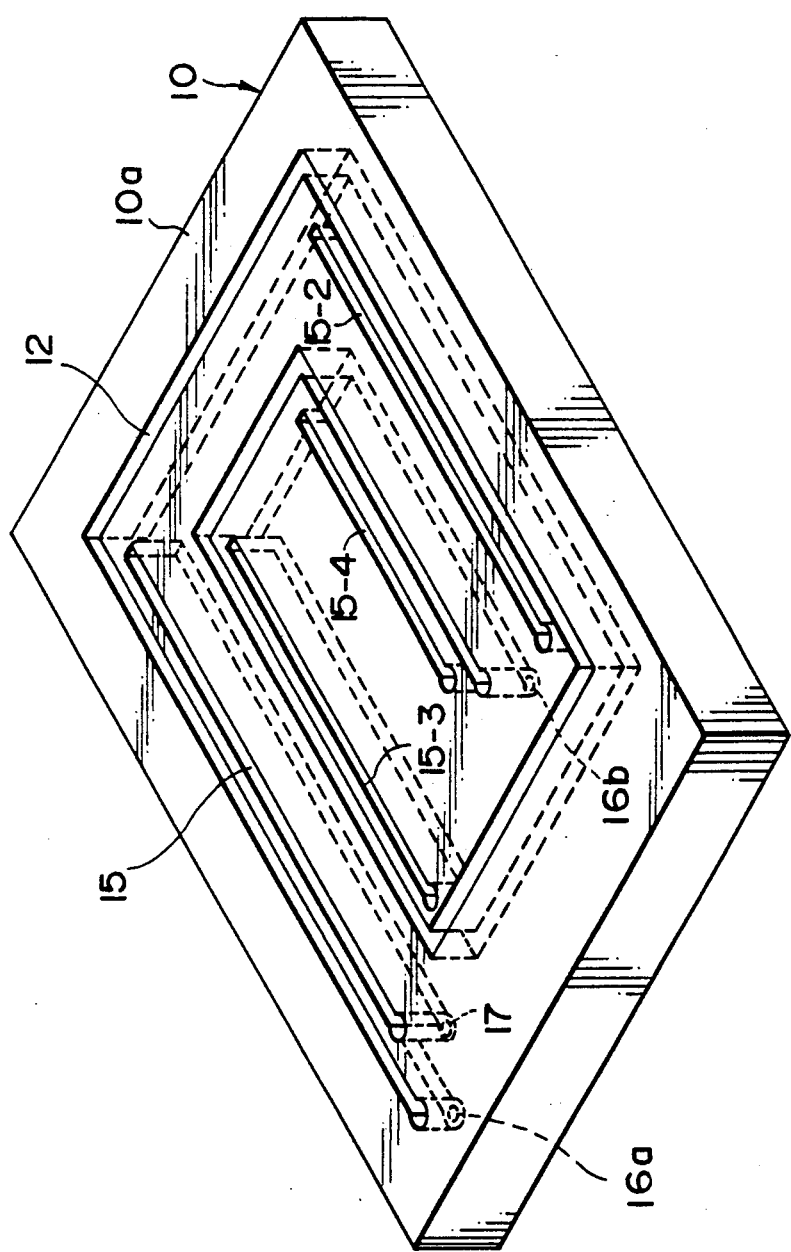

FIG. 8 shows a preferred embodiment of a split grounding type LC noise filter in accordance with the present invention.

As shown in FIG. 8, the noise filter of this embodiment is composed of the dielectric substrate 10 of a ceramic material or the like, a spiral groove 12 provided in the surface 10a of the substrate 10, and a plurality of ground grooves 15-1, 15-2, ... 15-4 each of which faces a part of the spiral groove 12. Each of the spiral grooves 12 and the ground grooves 15 is formed into a deep groove, as will be described later with reference to FIG. 11.

Figure 9:
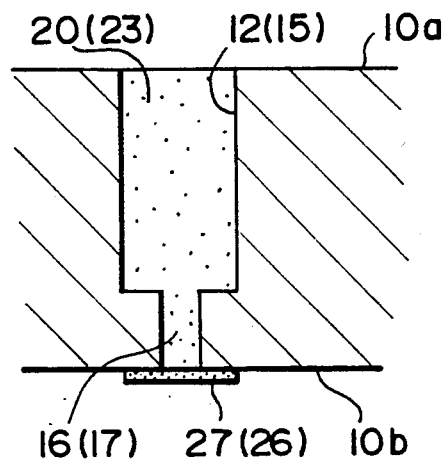

The spiral groove 12 is provided with through holes 16a and 16b at the outer end portion and the inner end portion, respectively. Similarly, each of the ground grooves 15 is provided with a through hole and 17 at one end portion thereof. Each of the through holes 16a, 16b, 17 is so designed as to communicate with the back surface 10b of the substrate 10 from the bottom surface of the groove, as shown in FIG. 9.

Figure 10A:
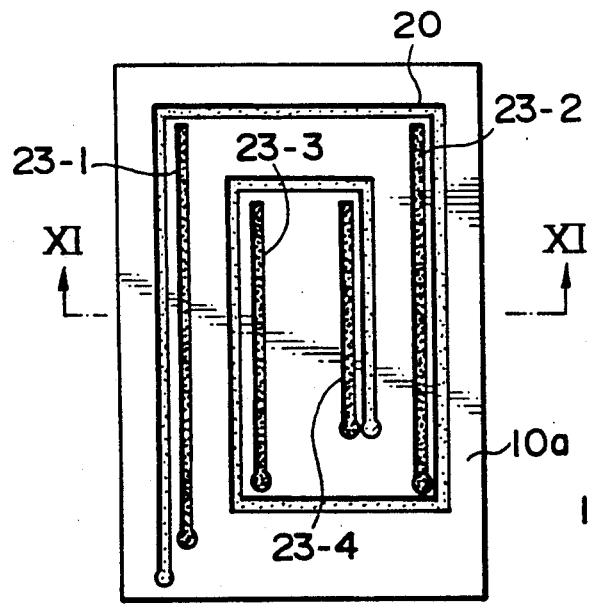

An inductor conductor 20 is provided in the spiral groove 12 provided in the surface 10a of the substrate 10, and grounding block conductors 23-1, 23-2, 23-3 and 23-4 are provided in the ground grooves 15-1, 15-2, 15-3 and 15-4, respectively, as shown in FIG. 10(A).

Figure 11:
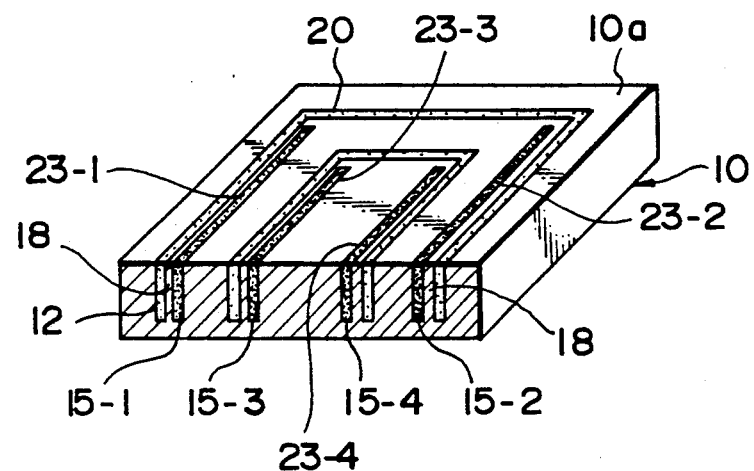

FIG. 11 is a schematic sectional view of the LC noise filter shown in FIG. 10(A), taken along the line XI—XI. As shown in FIG. 11, each of the grounding block conductors 23-1, 23-2, ... 23-4 faces a part of the inductor conductor 20 with the wall body 18 of the substrate 10 therebetween. Therefore, each of the grounding block conductors 23-1, 23-2, ... 23-4 capacitively couples with the inductor conductor 20 by an electrostatic capacity, and a capacitance C is provided therebetween in the form of a distribution constant.

Figure 10B:
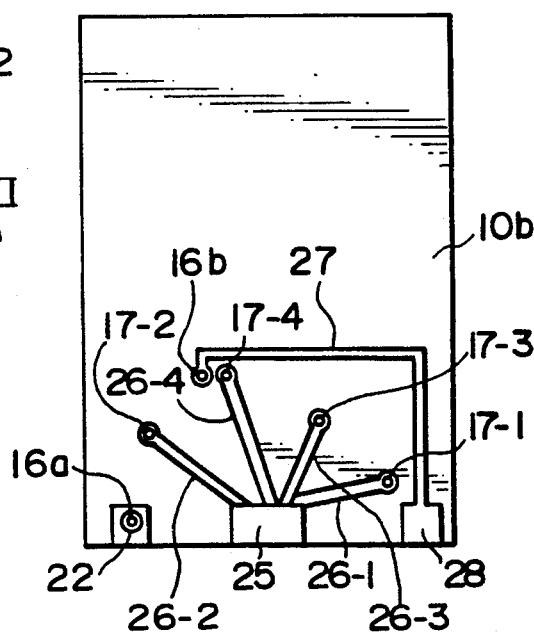

On the back surface 10b of the substrate 10, input and output terminals 22, 28 and a ground terminal 25 are provided, as shown in FIG. 10(B).

The one input and output terminal 22 is connected to the outer end portion of the inductor conductor 20 provided on the surface 10a of the substrate 10 through the through hole 16a, and the other input and output terminal 28 is connected to the inner end portion of the inductor conductor 20 through the through hole 16b and an input and output lead 27.

The ground terminal 25 is electrically connected to the grounding block conductors 23-1, 23-2, ... 23-4 provided on the surface 10a of the substrate 10 through the corresponding through holes 17-1, 17-2, ... 17-4 and the corresponding ground leads 26-1, 26-2, ... 26-4.

The conductors 20, 23, the terminals 22, 28, 25 and the leads 26, 27 are easily produced by applying a resist to the substrate 10 in advance except for the grooves 12, 15, and the portions for the terminals 22, 28, 25 and the leads 26, 27, and dipping the substrate 10 in a conductive tank which is filled with a liquid conductor.

These conductors, terminals and leads are also easily produced by dipping the substrate 10 without the application of a resist, and grinding the surfaces of the substrate 10 so as to remove the conductor which has adhered to the portions other than the grooves 12 and 15.

A method other than dipping may be adopted to provide the conductors 20, 23, the terminals 22, 28, 25 and the leads 26, 27 on the surface 10a and the back surface 10b of the substrate 10, as described in the first embodiment. For example, the substrate 10 may be plated with a conductor.

In this embodiment, it is preferable that one of the grounding conductors 23-1, 23-2, ... 23-1 is opposed to the inductor conductor 20 at a position close to the one terminal 22 of the inductor conductor 20 in the electric circuit, and that another grounding block conductor 23-1, 23-2, ..., 23-4 is opposed to the inductor conductor 20 at a position close to the other terminal 28 in the electric circuit.

For this purpose, the grounding block conductor 23-1 is so disposed as to face a part of the inductor conductor 20 at the position close to the terminal 22 in the electric circuit. The grounding block conductor 23-4 is so disposed as to face a part of the inductor conductor 20 at the position close to the terminal 28 in the electric circuit. The other two grounding block conductors 23-2 and 23-4 are respectively opposed to parts of the inductor conductor 20 between the input and output terminals 22 and 28.

In order to obtain a good attenuation characteristic, it is favorable that at least the grounding block conductors 23-1 and 23-4, which are disposed in proximity to the input and output terminals 22 and 28 lead out the leads 26-1 and 26-4 from the positions close to the terminals 22 and 28, respectively, and connect them to the ground terminal 25.

Figure 12:
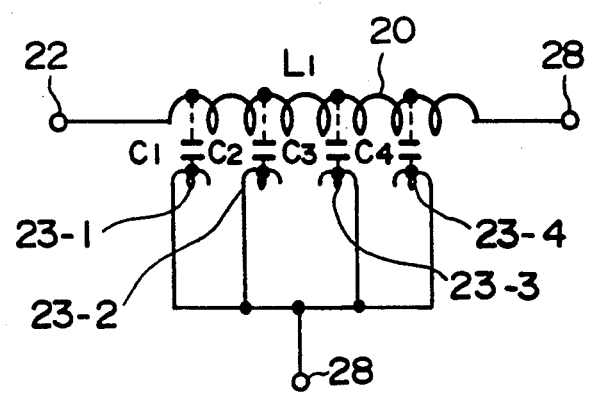

FIG. 12 is the equivalent circuit diagram of an LC noise filter of this embodiment. In this embodiment, the spiral inductor conductor 20 provides the inductance $L_1$. Each of the grounding block conductors 23-1, 23-2, ... 23-4 which is adjacent to the inductor conductor 20 capacitance couples to a part of the inductor conductor 20 by an electrostatic capacity, whereby the capacitors $C_1, C_2, C_3$ and $C_4$ are formed.

This embodiment offers the following advantages.

(1) According to this embodiment, each of the grounding block conductors 23-1, 23-2, ... 23-4 is formed into a block having a small area, and is connected to the ground terminal 25. Therefore, the eddy current flowing to each of the grounding block conductors 23-1, 23-2, ... 23-4 is small and the inductance thereof is small, so that the capacitors $C_1, C_2, \ldots C_4$ are directly connected to the ground terminal 25. This is equivalent to a plurality of LC noise filters connected to each other in series. That is, it is possible to obtain an LC noise filter which substantially functions as a distribution constant LC noise filter.

Therefore, according to this embodiment, it is possible to increase capacitance C by increasing the number of the grounding block conductors 23 and to reduce the capacitance C by reducing the number of the grounding block conductors 23.

Since the grounding block conductors 23-1 and 23-4 are disposed at the positions close to the input and output terminals 22, 28 in the electric circuit, an excellent attenuation characteristic is obtained in this embodiment.

Figure 13:
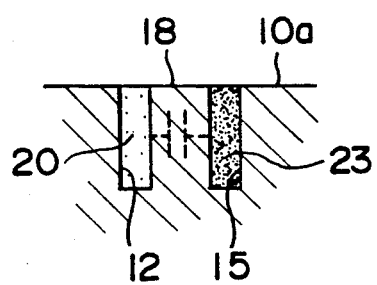

(2) In this embodiment, each of the grounding block conductors 23-1, 23-2, ... 23-4 is opposed to the inductor conductor 20 with the wall body 18 between the grooves 12 and 15 therebetween, as shown in FIG. 13, and the capacitances of the capacitors $C_1, C_2, \ldots C_4$ are provided in the form of a distribution constant therebetween. It is therefore possible to set the capacitance C at a large value, if necessary, by using a material having a high dielectric constant for the substrate 10.

(3) Each of the grounding block conductors 23-1, 23-2, ... 23-4 has a small area and is opposed to only a part of the inductor conductor 20. The mutual inductance between the inductor conductor 20 and each of the grounding block conductors 23-1, 23-2, ... 23-4 is substantially negligible, so that it is possible to greatly reduce the mutual inductance component which is a cause of the deterioration of the characteristics of a noise filter.

(4) In the noise filter of this embodiment, the grounding block conductor 23 is so designed as not to block the magnetic path of the inductor conductor 20.

The magnetic flux generated when the inductor conductor 20 is energized passes between the lines of the inductor conductor 20 from the surface side of the substrate 10 to the back side, or in the reverse direction. If the block conductor 23 is provided in such a manner as to block the magnetic path (e.g., if the block conductor 23 is provided in such a manner as to face the region between the lines of the inductor conductor 20), the magnetic path is blocked by the block conductor 23 and the inductor conductor 20 cannot sufficiently function as an inductor.

In contrast, in this embodiment, since each of the block conductors 23 is provided adjacently to the inductor conductor 20, the magnetic path of the inductor conductor 20 is not obstructed by the block conductor 23 at all, and the effect of the LC noise filter is fully produced without reducing the inductance of the spiral inductor conductor 20.

If the terminals 22 and 28 of the inductor conductor 20 are used as the input and output terminals, the LC noise filter of this embodiment can be used as a normal mode noise filter having good electric characteristics.

(5) In this embodiment, the inductor conductor 20 and the grounding block conductor 23 are provided in the spiral groove 12 and the ground groove 15, respectively, provided in the surface 10a of the substrate 10. Therefore, the inductor conductor 20 and the grounding block conductor 23 are properly insulated from each other by the wall body 18 of the substrate 10, thereby preventing short circuit between lines of the inductor conductor 20 or between the inductor conductor 20 and the grounding block conductor 23. Accordingly, the noise filter of this embodiment solves not only the first and third problems but also the second problem and also functions as a normal mode noise filter having excellent electric characteristics in a wide region ranging from a low-frequency zone to a high-frequency zone.

(6) Furthermore, in this embodiment, the inductor conductor 20 is provided in the ground groove 15, it is possible to determine the sectional configuration and area of the inductor conductor 20 more freely in comparison with the related art in which the inductor conductor 20 is so formed as to coat the surface of the substrate 10. For example, by forming the inductor conductor 20 so as to have a large sectional area, it is possible to provide an LC noise filter very suitable as an LC noise filter for the power source for a comparatively large energizing current.

Figure 14:
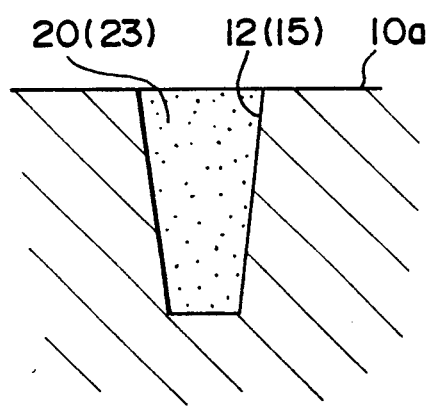

The spiral groove 12 and the ground groove 15 may be tapered toward the outside, if necessary, as shown in FIG. 14. Adoption of this configuration to the spiral groove 12 and the ground groove 15 enables the inductor conductor 20 and the grounding block conductor 23 to be provided with certainty in the grooves 12 and 15, respectively, by dipping the substrate 10 in a conductive tank even if these grooves 12, 15 are of a deep groove type.

Figure 15:
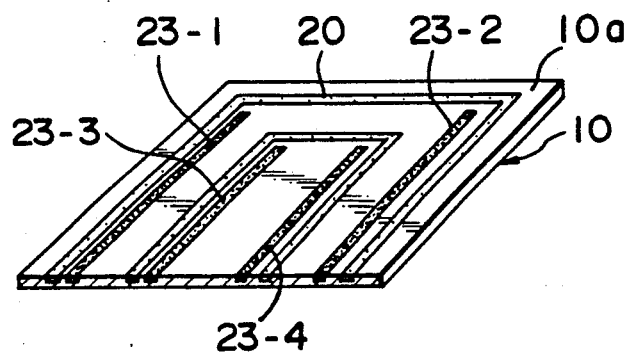

Although the grooves 12 and 15 are of a deep groove type in this embodiment, they may also be a shallow groove type, if necessary, as shown in FIG. 15, which is a schematic sectional view of the LC noise filter shown in FIG. 10(A), taken along the line XI—XI. Such a shallow groove type LC noise filter is suitable as a noise filter for signal lines and since it is possible to reduce the thickness of the substrate 10, the shallow groove type LC noise filter is suitable when it is attached to a portion which has many limitations in space.

(7) Furthermore, according to this embodiment, since the inductor conductor 20 and a plurality of grounding block conductors 23-1, 23-2, . . . 23-4 are provided on the surface 10a of the substrate 10, it is possible to use the back surface 10b of the substrate 10 for wiring conductors 20, 23-1, 23-2, . . . 23-4 and the terminals 22, 28 and 25. Thus, the wiring of the entire circuit is simplified.

Especially, in the case of a normal mode noise filter, the wiring is produced with only the provision of the two input and output terminals 22 and 28 and the one ground terminal 25 on the back surface 10b of the substrate 10 and external connection is easily carried out by using these three terminals 22, 28 and 25.

In this way, according to this embodiment, the connection between each of the grounding block conductors 23 and the ground, which is required when a multiplicity of grounding block conductors 23 are provided, is facilitated by using a common ground terminal 25. For example, when the noise filter of this embodiment is incorporated into a surface mounted device (SMD) type device, this device is required to provide only three pins connected to the respective terminals 22, 28 and 25 for the purpose of connection to an external circuit.

Fifth Embodiment

Figure 16:
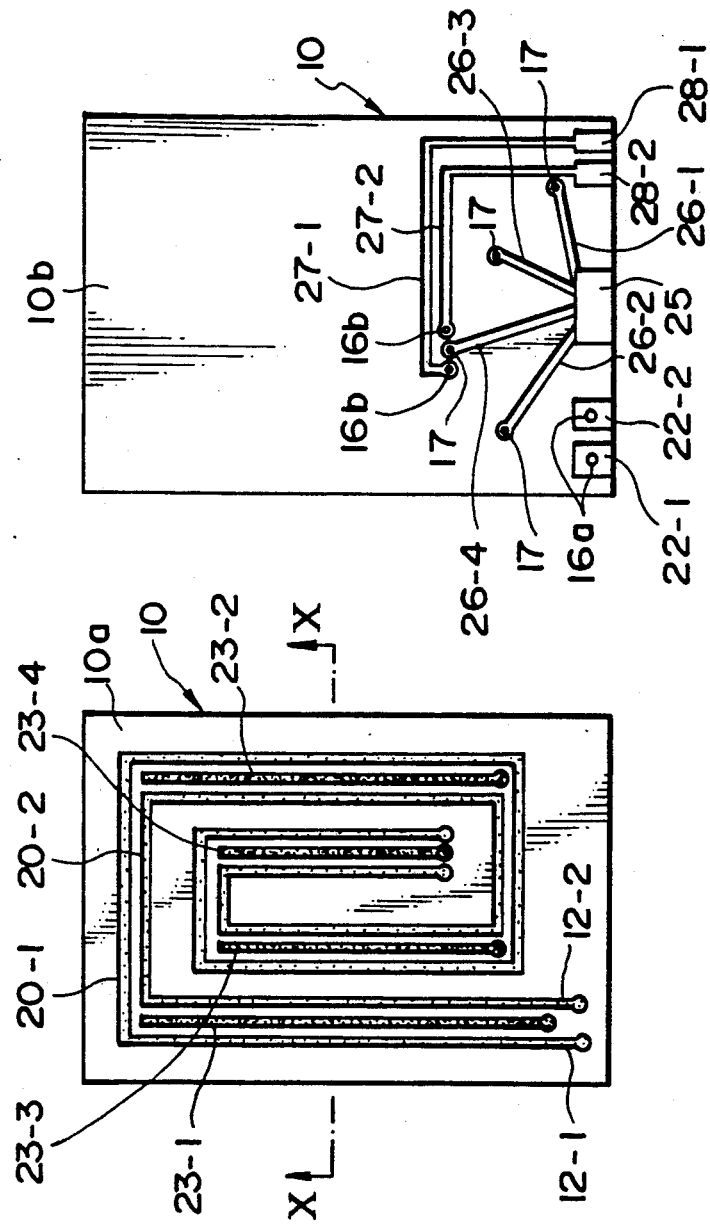
Figure 17:
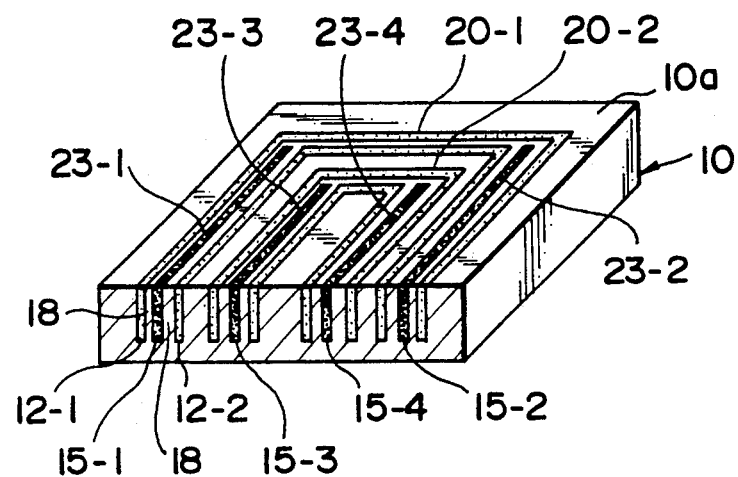

FIGS. 16 and 17 show a fifth embodiment of the present invention.

The noise filter of this embodiment is composed of a pair of concentrically adjacent spiral grooves 12-1, 12-2 provided in the surface 10a of the substrate 10, and a plurality of ground grooves 15-1, 15-2, . . . 15-4, provided between the spiral grooves 12-1 and 12-2, as shown in FIG. 16(A).

As shown in FIG. 17, the inductor conductors 20-1, 20-2 are provided in the spiral grooves 12-1, 12-2, respectively, and the grounding block conductors 23-1, 23-2, . . . 23-4 are provided in the respective ground grooves 15-1, 15-2, . . . 15-4.

A pair of input and output terminals 22-1, 28-1 and 22-2, 28-2, and the ground terminal 25 are provided on the back surface of the substrate 10, as shown in FIG. 16(B). The input and output terminals 22-1, 22-2 are electrically connected to the outer end portions of the corresponding inductor conductors 20-1, 20-2 through the through holes 16a, and the other input and output terminals 28-1, 28-2 are electrically connected to the inner end portions of the corresponding inductor conductors 20-1, 20-2 through the through holes 16b, and leads 27-1 and 27-2, respectively. The ground terminal 25 is electrically connected to the grounding block conductors 23-1, 23-2, . . . 23-4 through the through holes 17, and the leads 26-1, 26-2, . . . 26-4, in the same way as in the fourth embodiment.

Figure 18:
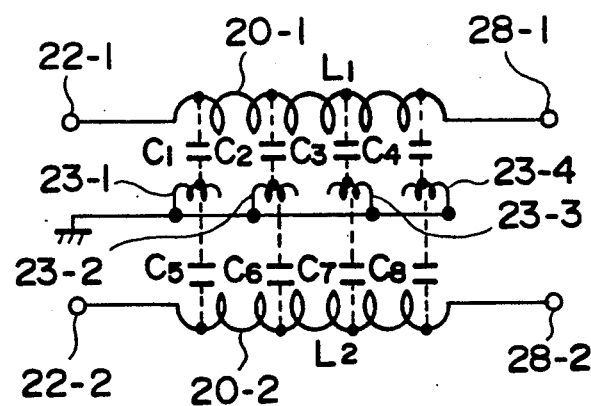

FIG. 18 is the equivalent circuit diagram of the LC noise filter of this embodiment. The spiral inductor conductor 20-1 provides the first inductance $L_1$ and the spiral inductor conductor 20-2 provides the second inductance $L_2$.

The group of grounding block conductors 23-1, 23-2, . . . 23-4 provided on the surface of the substrate 10 forms the capacitors $C_1$, $C_2$, $C_3$, and $C_4$ with the inductor conductor 20-1 which faces the grounding block conductors 23-1, 23-2, . . . 23-4 with the wall body 18 of the substrate 10 therebetween, as shown in FIG. 17. The capacitors $C_1$, $C_2$, $C_3$ and $C_4$ do not obstruct the magnetic path of the opposite inductor conductor 20-1 and provide the capacitances in the form of a distribution constant.

Similarly, the group of grounding block conductors 23-1, 23-2, . . . 23-4 forms capacitors $C_5$, $C_6$, $C_7$ and $C_8$ with the other inductor conductor 20-2. The capacitors $C_5$, $C_6$, $C_7$ and $C_8$ do not obstruct the magnetic path of the opposite inductor conductor 20-2 and provide the capacitances in the form of a distribution constant.

Accordingly, the noise filter of this embodiment functions as a common mode four-termial noise filter having the circuit structure shown in FIG. 18.

Although four grounding block conductors 23 are provided with respect to the inductor conductors 20-1 and 20-2 in this embodiment, the number of the grounding block conductors 23 is not restricted to four, and it is possible to produce a distribution constant common mode noise filter having a given capacitance by varying the number of the grounding block conductors 23 as occasion demands.

A pair of inductor conductors 20-1, 20-2 and a multiplicity of grounding block conductors 23-1, 23-2, . . . 23-4 are provided on the surface 10a of the substrate 10 in this embodiment. Therefore, the back surface 10b of the substrate 10 can be used for wiring, and electric connection is easily carried out merely by connecting the conductors 20-1, 20-2, 23-1, 23-2, . . . 23-4 to the five terminals 22-1, 22-2, 28-1, 28-2 and 25 provided on the back surface 10b of the substrate 10. Since it is unnecessary to provide an additional lead between the terminals and conductors, a noise filter having a simple structure and good electric characteristics is obtained.

Sixth Embodiment

Figure 19:
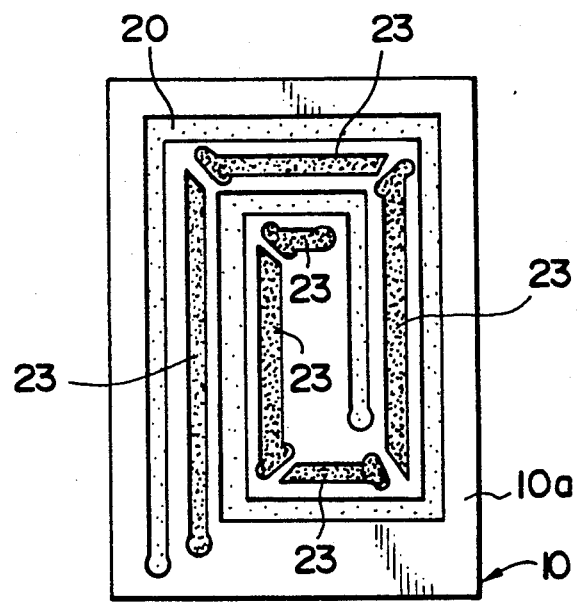
FIG. 19 is an explanatory view of a sixth embodiment of the present invention.

FIG. 19 shows a sixth embodiment of the present invention.

This embodiment is characterized in that a plurality of grounding block conductors 23 are intermittently provided between the lines of the inductor conductor 20 in the noise filter shown in FIG. 10 so that each of the grounding block conductors 23 functions as a shield conductor which prevents short circuit between lines of the inductor conductor 20.

On one end of each of the grounding block conductors 23 a through hole is provided as in the fourth embodiment, and each of the grounding block conductors 23 is connected to the ground terminal 25 through the through hole, the lead 26, etc.

By virtue of this structure, the noise filter of this embodiment can prevent a short circuit between lines more reliably than the fifth embodiment.

Seventh Embodiment

Figure 20:
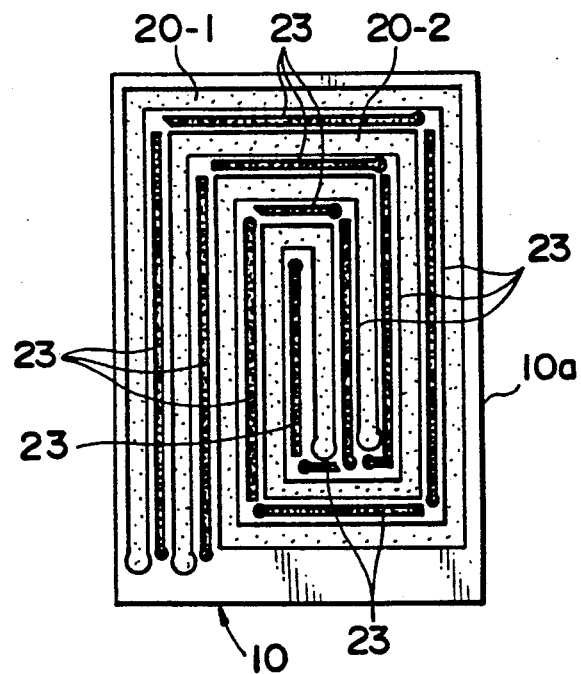
FIG. 20 is an explanatory view of a seventh embodiment of the present invention.

FIG. 20 shows a seventh embodiment of the present invention.

The LC noise filter of this embodiment is characterized in that a plurality of grounding block conductors 23 are intermittently provided between the lines of the inductor conductor 20-1 and the inductor conductor 20-2 in the noise filter shown in FIG. 16 so that each of the grounding block conductors 23 functions as a first shield conductor which prevents a short circuit between lines and in that a plurality of grounding block conductors 23 are also intermittently provided between the lines of the inductor conductor 20-2 and the inductor conductor 20-1 so that each of the grounding block conductors 23 functions as a second shield conductor which prevents a short circuit between lines of the inductor conductors 20-2 and 20-1.

Each of the grounding block conductors 23 is connected to the ground terminal 25 through the through hole provided in the ground groove 15, the ground lead 26 provided on the back surface of the substrate 10 in the same way as in the sixth embodiment.

According to this embodiment, it is possible to produce a common mode four-terminal noise filter having excellent electric characteristics in a wide region ranging from a low-frequency zone to a high-frequency zone and being capable of preventing short circuit between lines of the inductor conductors 20-2 and 20-1 more reliably as compared with the fifth embodiment.

As explained above, according to the fourth to seventh embodiments, at least one grounding block conductor is provided in such a manner as to be adjacent to a part of the inductor conductor and the grounding block conductor individually forms a capacitor between each block conductor and inductor conductor. It is therefore possible to produce an LC noise filter which has an inductance from the inductor conductor and a capacitance of each block conductor and sufficiently functions as a distribution constant noise filter.

According to these embodiments, it is easy to obtain a distribution constant LC noise filter having a given capacitance by varying the number of block conductors.

Furthermore, by providing an inductor conductor and the grounding block conductor in a spiral groove and a ground groove provided in at least one surface of a dielectric substrate such that the inductor conductor and the grounding block conductor are adjacent to each other with the wall body of the substrate therebetween, it is possible to produce a distribution constant LC noise filter having a sufficient capacitance and excellent electric characteristics without lowering the inductance of each inductor conductor. Especially, according to these embodiments, since the short circuit between lines of the inductor conductor is safely prevented by virtue of the wall body, it is possible to produce a distribution constant LC noise filter having excellent electric characteristics in a wide region ranging from a low-frequency zone to a high-frequency zone.

In addition, since the inductor conductor and the grounding block conductor are provided on the same surface of a dielectric, wiring between each inductor conductor and terminal is facilitated by utilizing the other surface of the substrate.

In these embodiments, the grooves formed in the substrate 10 may have a given depth.

Eighth Embodiment

Figure 26A:
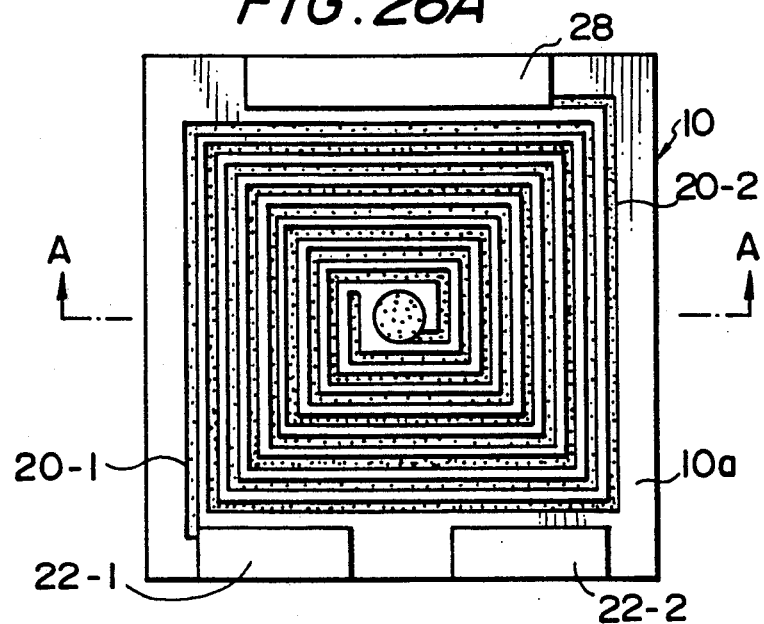
FIGS. 26(A)–26(C) and 27 are explanatory views of a further embodiment of the present invention, which is a deep groove type LC noise filter.

FIG. 26 shows an eighth embodiment of the present invention. The LC noise filter of this embodiment is characterized in that the substrate 10 is thick and the concentrically adjacent spiral grooves 12-1, 12-2 are formed into deep grooves on the surface of the substrate 10. In the LC noise filter of this embodiment, two concentrically adjacent deep spiral grooves 12-1, 12-2 are provided in the surface of a thick chip-like substrate 10, and the first and second inductor conductors 20-1, 20-2 are provided in the spiral grooves 12-1, 12-2, respectively, in the same way as in the first embodiment. The outer end portions of these inductor conductors 20-1, 20-2 are connected to the terminals 22-1, 22-2, respectively.

Figure 26B:
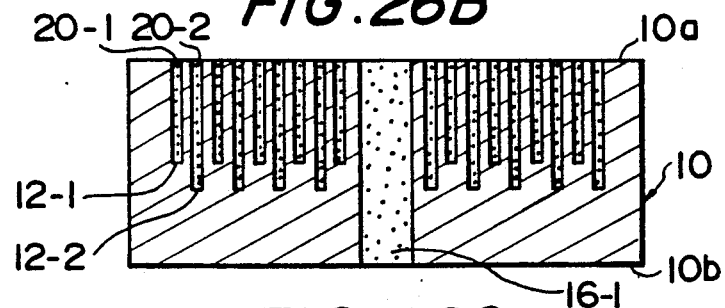
Figure 26C:
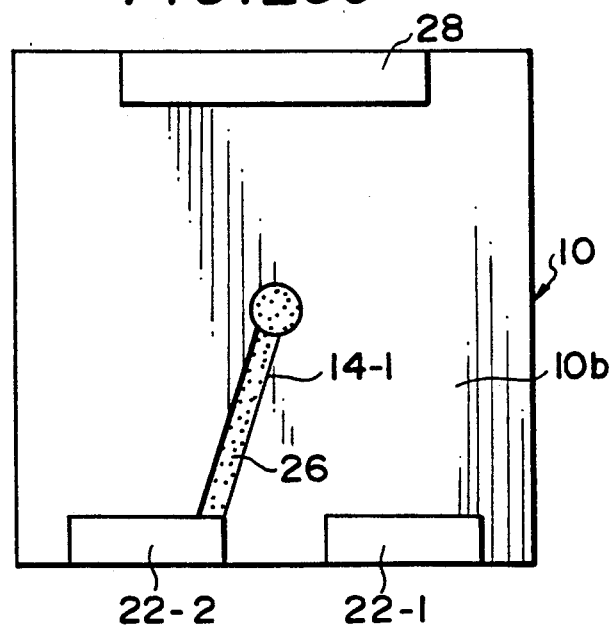

As shown in FIG. 26(C), the groove 14-1 provided on the back side of the substrate 10 is provided with a lead 26, the outer end portion of the lead 26 being connected to the terminal 22-1 and the inner end portion thereof being connected to the inner end portion of the first inductor conductor 20-1 through the through hole 16-1, as shown in FIG. 26(B), which is a sectional view of the eighth embodiment shown in FIG. 26 (A), taken along the line A—A.

Figure 27:
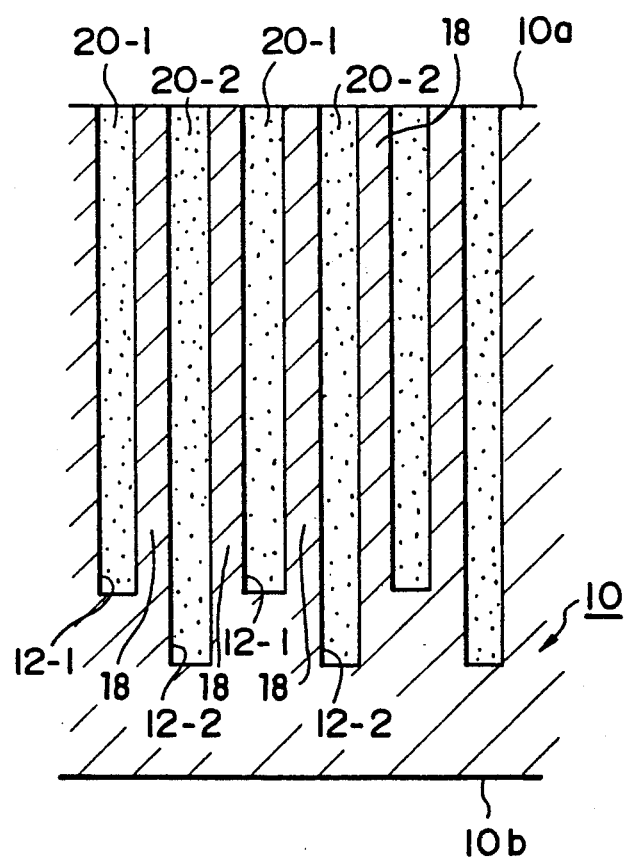

In this way, in the LC noise filter of this embodiment, each of the spiral grooves 12-1, 12-2 has a predetermined depth. As a result, the first and second inductor conductors 20-1, 20-2 have a structure substantially equivalent to that of two belt-like conductors laminated through the dielectric and spirally wound. These first and second inductor conductors 20-1, 20-2 are opposed to each other with the wall body 18 between the grooves 12-1, 12-2 therebetween, as shown in FIG. 27, whereby a sufficient capacitance is formed therebetween in the form of a distribution constant.

Thus, according to this embodiment, a distribution constant LC noise filter having a larger constant than the first embodiment can be obtained.

In this embodiment, it is preferable that the spiral groove 12-2 for providing the grounding inductor conductor 20-2 therein is slightly deeper than the spiral groove 12-1 for providing the energizing inductor conductor 20-1 therein. By virtue of this structure, the layers of the energizing spiral inductor conductor 20-1 are sufficiently shielded by the grounding inductor conductor 20-2, thereby ensuring prevention of a short circuit between lines.

The LC noise filter of this embodiment is not plate-like as in the first to seventh embodiments but formed into what is called a chip. Therefore, the noise filter of this embodiment is suitable as an SMD (surface mounted device) type LC noise filter.

Figure 28C:
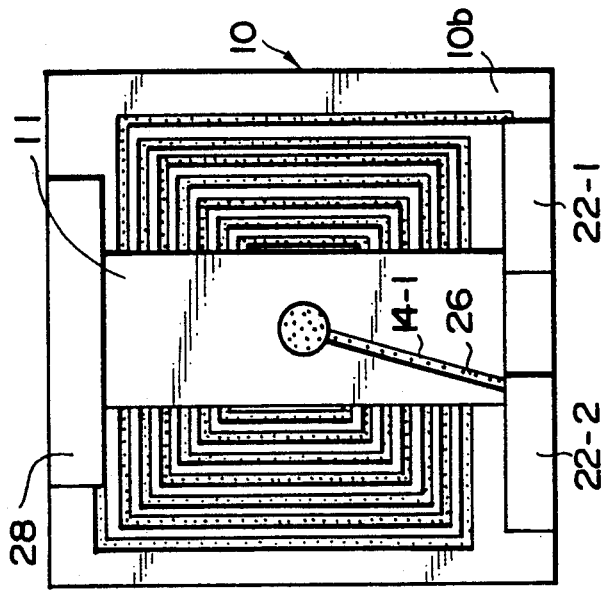
FIGS. 28(A)–28(C) and 29 are explanatory views of a modification of a deep groove type LC noise filter shown in FIGS. 26 and 27.
Figure 28A:
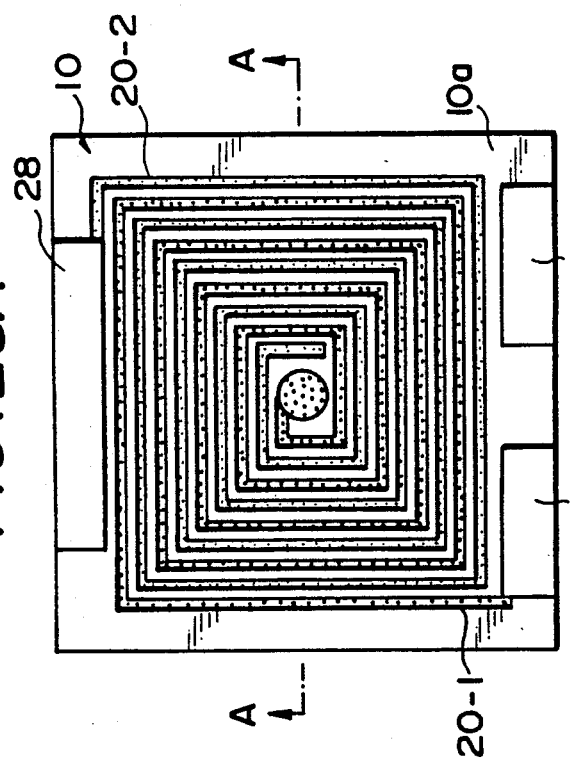
Figure 28B:
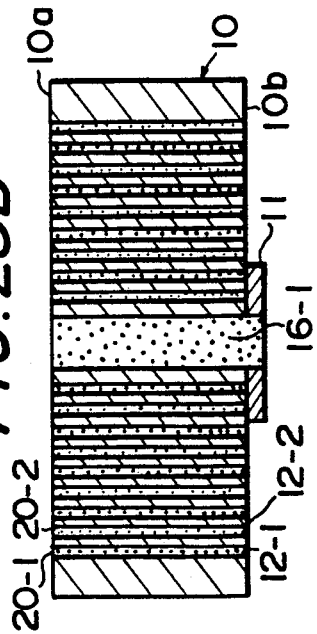
Figure 29:
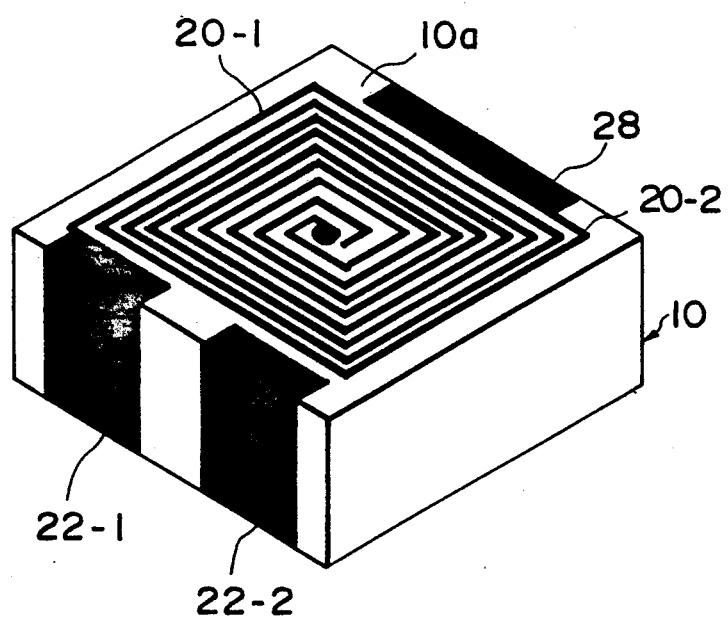
Figure 30A:
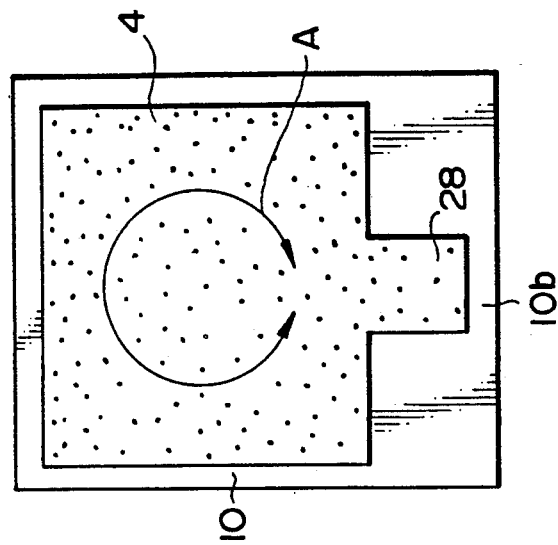
FIG. 30(A), 30(B) are an explanatory view of a conventional noise filter.
Figure 30B:
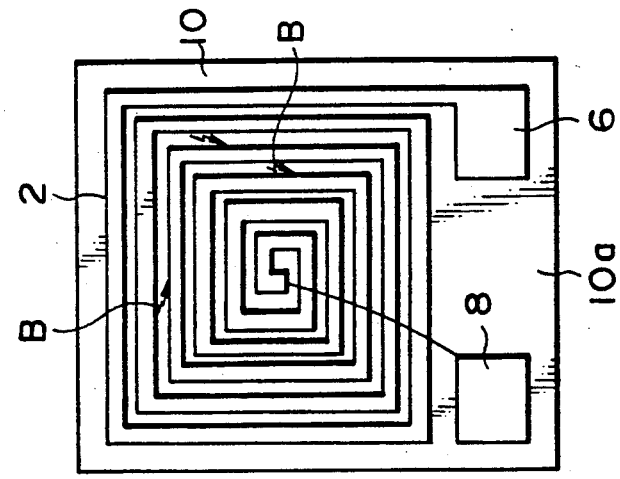

FIGS. 28 and 29 show an example of a deep groove type noise filter in which the spiral grooves 12-1, 12-2 are provided in the surface of the substrate 10 in such a manner as to penetrate through the substrate from the surface to the back surface thereof.

In this case, since the grooves are formed from the surface of the substrate 10 to the back side thereof, a reinforcing presser plate is preferably provided on the surface or the back surface of the substrate 10. In this example, a presser plate 11 is integrally provided on the back surface of the substrate 10, and a groove 14 communicating with the through hole 16 is provided on the surface of the presser plate 11.

In the LC noise filter of this embodiment, the electrode terminals 22-1, 22-2 and 28 are attached to the substrate 10 by an adhesive or the like which has a sufficient thermal resistance to, for example, the soldering heat.

The conductors 20-2, 20-2 and the leads 26 are then produced by applying a resist to the substrate 10 in advance except for the grooves, and dipping the substrate 10 in a conductive tank which is filled with a liquid conductor. Since the spiral grooves 12-1, 12-2 are formed from the surface to the back surface of the substrate 10, it is possible to uniformly pour the conductor therein in spite of the large depth, thereby forming a good spiral conductor.

By molding the noise filter with an insulating resin or the like (or covering the noise filter with an insulating material) thereafter, an SMD type LC device is obtained.

Such a deep groove type LC noise filter is not limited to the first embodiment and is widely applicable, for example, to the LC filters of the second to seventh embodiments.

For example, if this embodiment is applied to an LC device having the spiral groove 12 and the ground groove 15 such as that shown in FIG. 8, a good split grounding type LC device is obtained.

Ninth Embodiment

In an LC noise filter of this embodiment, the inductance L and the capacitance C can be set as desired by appropriately selecting the material of the substrate 10 as well as the number of turns of the inductor conductor 20 and the number of the grounding block conductors 23.

For example, in order to provide a large inductance L, a magnetic material is used for the substrate 10, while in order to provide a large capacitance C, a material having a high dielectric constant such as a ceramic material is used for the substrate 10 or the depth of the grooves 12, 15 and the thickness of the wall body 18 is adjusted. In order to increase both L and C, both a material having a high dielectric constant and a magnetic material are used for the substrate 10.

By laminating a plurality of noise filters and connecting the noise filters in series or in parallel, a noise filter having given L and C is obtained. By connecting the laminated noise filters in series, it is possible to use the noise filter as an LC noise filter circuit having large inductance which cannot be obtained by a single noise filter.

Alternatively, by accommodating the noise filter of any of the first to eighth embodiments in a housing which constitutes a magnetic circuit, a large inductance L is obtained.

Figure 21:
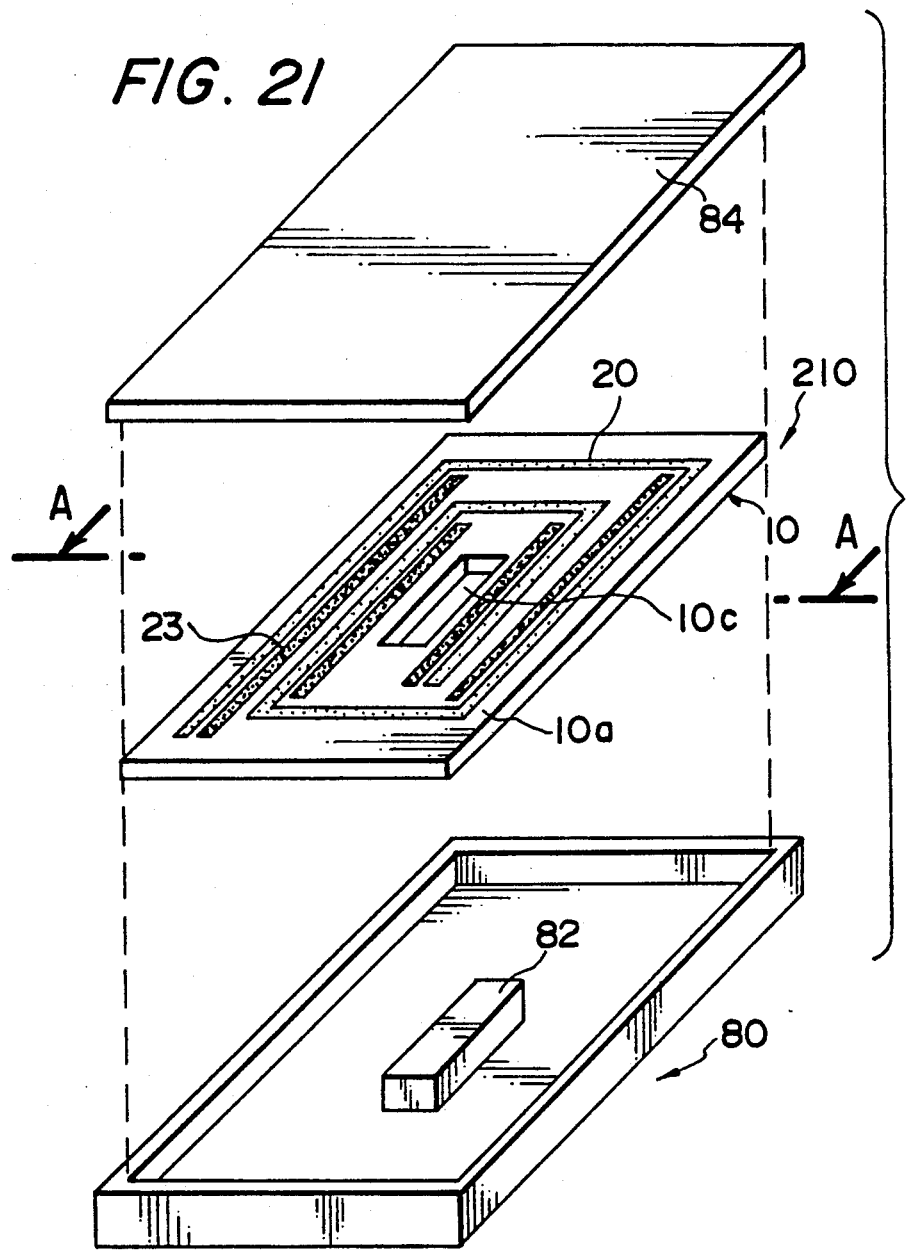
FIG. 21 is an explanatory view of another embodiment of an LC noise filter of the present invention which uses a housing.

FIG. 21 shows an example of such a noise filter. This noise filter is characterized in that a noise filter 210 according to one of the first to eighth embodiments is accommodated in a housing 80 made of a magnetic material.

A core insertion hole 10c is formed substantially at the center of the substrate 10, and a core 82 provided at the central portion of the housing 80 is inserted into the core insertion hole 10c. When a cover 84 is fixed to the housing 80, a closed magnetic circuit exclusively for the noise filter is formed between the core 82 and the housing 80 and the cover 84 around the core 82.

In this way, the noise filter of this embodiment constitutes an LC noise filter having a predetermined large inductance.

Although the closed magnetic circuit is formed by using the housing in this embodiment, the housing may be so designed as to constitute an open magnetic circuit, if necessary.

Figure 22:
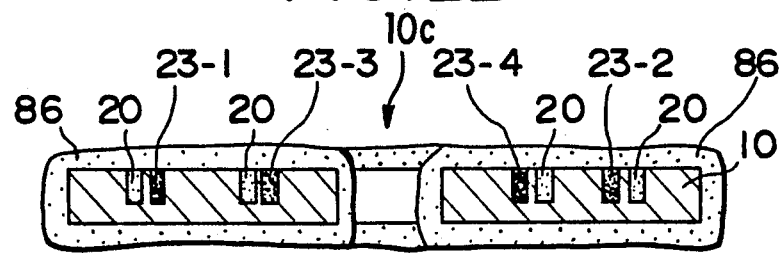
FIG. 22 is an explanatory view of still another embodiment of an LC noise filter of the present invention in which a closed magnetic circuit is formed by magnetic powder coating.

FIG. 22 shows a sectional view of an example of a noise filter with the surface of the substrate 10, e.g., substrate 10 of noise filter 210 of FIG. 21, coated with a magnetic powder.

In the noise filter of this embodiment, the core insertion hole 10c is formed substantially at the center of the substrate 10, and the surface and the back surface of the substrate 10 are coated with a magnetic powder. The magnetic powder coating layer 86 constitutes a closed magnetic circuit exclusively for the noise filter, and thereby greatly reduces the leakage of the magnetic flux to the outside.

Accordingly, for example, when a plurality of the noise filters of this embodiment are arranged adjacently to each other and used as a multi-channel noise filter, the noise filter exhibits excellent electric characteristics substantially without mutual interference such as ringing between adjacent noise filters.

Example of noise filter using PC board as substrate

In the present invention, a distribution constant LC noise filter having good electric characteristics is obtained by utilizing the insulating substrate 10, as shown in the above-described embodiments. For example, if a PC board is used as the insulating substrate 10, it is possible to provide a given number of distribution constant LC noise filters without increasing the thickness of the PC board itself.

A noise filter produced by providing distribution constant noise filters on a PC board is very suitable as a noise filter for various electronic machines which have recently been required to be smaller and lighter than ever. For example, by providing a noise filter on a PC board, it is possible to greatly reduce the thickness and weight of the apparatus as a whole than a conventional chip-type noise filter. As a PC board, a PC board in the form of a film or a sheet may be used as well as an ordinary PC board in the form of a plate.

For example, by using a distribution constant LC noise filter of the present invention for a lap-top computer, it is possible to reduce the size and the weight of the lap-top computer.

It is also easy to mount a given number of LC noise filters of the present invention on a PC board (in the form of a film) for an IC card, which is impossible due to the limitation in the thickness in the prior art which uses a conventional noise filter.

Since the distribution constant LC noise filter of the present invention can be easily produced merely by printing the circuit on a PC board, it is easy to mount the noise filter on a PC board for various uses without increasing the thickness of the PC board.

Figure 23:
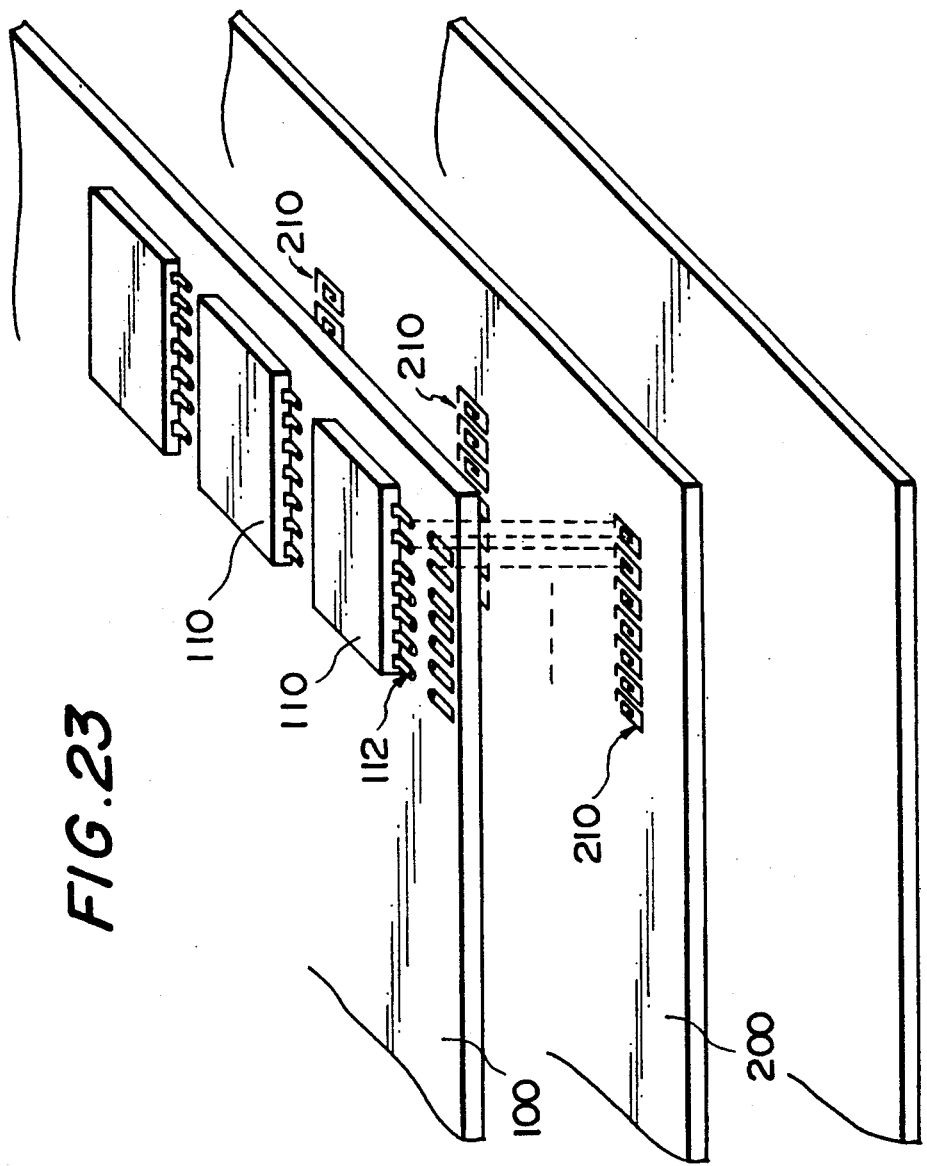
FIG. 23 is an explanatory view of a multi-channel noise filter produced by laminateing PC boards and providing LC noise fileters of one of the above-described embodiments on one of the laminated PC boards.

FIG. 23 shows an example of a multi-channel noise filter for signal lines provided on a PC board.

In this example, a plurality of IC's 110 are mounted on a PC board 100, and a plurality of signal lines 112 are connected to each of the IC's 110.

On the underside of the PC board 100, a PC board 200 provided with multi-channel noise filters is disposed for lamination. On the PC board 200, a plurality of LC noise filters according to one of the first to ninth embodiments are provided at the positions which correspond to the input and output leads 112 of the respective IC's 110. In this way, multi-channel noise filters 210 which correspond to the leads 112 of the respective IC's 110 are provided on the PC board 200.

Such a multi-channel noise filter 210 can be easily provided on the PC board 200 by, for example, using a technique such as printing, and the size of the multi-channel noise filter 210 can be controlled so as to be installed even in a small space with the required L and C.

The PC board 200 is disposed under the PC board 100 for lamination, and the multi-channel noise filters 210 are electrically connected to the respective leads 112 of the IC's 110 which are situated thereabove.

In this way, a multi-channel noise filter is provided on the PC board 200 without increasing the thickness of the board 200, thereby enabling the reduction in size and weight of an electronic machine itself.

Although, the multi-channel noise filter 210 is provided on the board 200 different from the PC board 100 provided with the IC's 100, etc. in this example, the present invention is not restricted to this example, and if there is a sufficient space on the PC board 100 with the IC's 110 mounted thereon, the multi-channel noise filter 210 may also be provided on the PC board 100.

In this example, the multi-channel noise filter 210 for signal lines is provided on the PC board 200. It is also possible to provide a noise filter for a power source line, if necessary.

Figure 24:
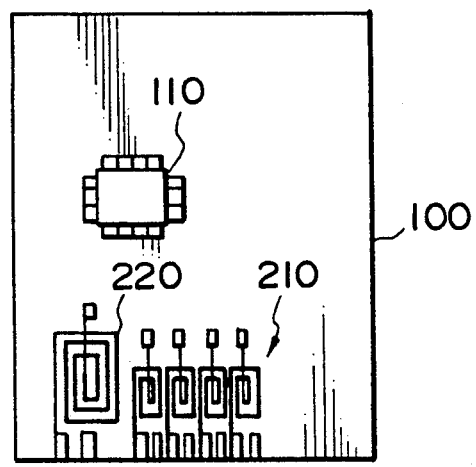
FIG. 24 is an explanatory view of a PC board provided with a multi-channel noise filter for signal lines and a multi-channel noise filter for a power source line together with an IC.

FIG. 24 shows an example of the PC board 100 provided with the multi-channel noise filter 210 for signal lines and a noise filter 220 for a power source line together with the IC 110. The PC board 100 having such a circuit structure is very suitable as a PC board for an IC card. If there are a plurality of IC's 110, the noise filter 230 for a power source line may be formed into a multi-channel noise filter in conformity with the number of the IC's 110.

In a portable machine which is not equipped with a sufficient grounding box body such as an IC card, it is preferable to use a common mode noise filter.

Figure 25:
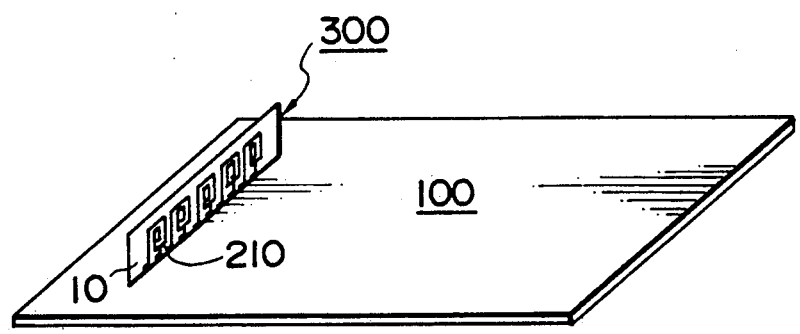
FIG. 25 is an explanatory view of a multi-channel noise filter provided on an insulating rectangular substrate and mounted on a PC board.

FIG. 25 shows an example of a multi-channel noise filter 300 produced by providing a plurality of noise filters of one of the above-described embodiments on the rectangular insulating substrate 10.

The multi-channel noise filter 300 of this example can be easily mounted on the PC board 100 like an ordinary electronic part, and can be used as, for example, a multi-channel noise filter for an IC. Alternatively, a film substrate may be used as the insulating substrate 10 and the film substrate 10 provided with the multi-channel noise filter may be mounted on the PC board 100 not vertically as shown in FIG. 25 but horizontally. In this way, even when the PC board 100 is installed at a place having a limitation in thickness, a multi-channel noise filter can be mounted on the PC board 100 without increasing the thickness of the board 100.

The noise filter of the present invention can be used not only as a noise filter for signal lines but also as a noise filter for a power source line, for example, the power source line of an IC. As described above, as the insulating substrate used for the noise filter of the present invention, an insulating film in the form of a film, a sheet or the like may be used as occasion demands.

The present invention is not limited to the above-described embodiments and various modifications are possible within the scope of the invention.

For example, if the noise filter of the present invention is produced as an SMD type device, it may be considered that one noise filter is insufficient for obtaining the required L and C. In this case, a plurality of noise filters are laminated together and those noise filters are connected in series or in parallel so as to obtain an LC noise filter having a predetermined C and L.

In the above-described embodiments, a short circuit between lines of the inductor conductor used as the energizing conductor is prevented by using the wall body 18 of the substrate 10. In addition to this, by coating the surface 10a or both the surface 10a and the back surface 10b of the substrate 10 provided with the conductors with an insulating shield layer, a short circuit between lines is effectively prevented.

If a material such as a high-frequency absorbing heating element is used as the substrate 10 in the above-described embodiments, the noise, in particular, the high-frequency noise contained in a signal passing the inductor conductor 20 is absorbed as heat, thereby enabling more effective removal of noise.

As the substrate 10, a ceramic material used for a varistor may be used, if necessary, so as to remove lightning surges or the like.

In the above-described embodiments, it is possible to reduce the magnetic resistance of the inductor conductor 20 and increase the inductance by adhering a magnetic material to the surface of the inductor conductor 20 and the grounding block conductor 23 by plating or the like so as to make the conductors into magnetic materials. If an insulating material is used as the magnetic material, a short circuit between lines is prevented more effectively.

Although a dielectric material is formed into the plate-like substrate 10 in the above-described embodiments, the present invention is not restricted thereto, and a cylindrical dielectric a such as a circular or square cylindrical dielectric structure may be used. In this case, a spiral groove and a ground groove are provided in either inner or outer peripheral surface of the cylindrical body and an inductor conductor and a grounding block conductor are provided in the respective grooves. An inductor conductor and a grounding block conductor may also be provided on both inner and outer peripheral surfaces of the cylindrical body.

In the above-described embodiments, the inductor conductor 20 and the grounding block conductor 23 are provided in the spiral groove 12 and the ground groove provided in the surface 10a of the substrate 10, but the present invention is not restricted thereto, and the inductor conductor 20 and the grounding block conductor 23 may be directly provided on the surface 10a of the substrate without providing the grooves although the characteristics become slightly inferior.

What is claimed is:

1. An LC noise filter comprising:

a dielectric material;
a plurality of spiral grooves provided in at least one surface of said dielectric material in such a manner as to be concentrically adjacent to each other; and
a plurality of inductor conductors at least one of which is provided in each of said grooves;
each of said inductor conductors forming a capacitor with the inductor conductor adjacent thereto with a wall body of said dielectric material therebetween.

2. An LC noise filter according to claim 1, wherein at least one of said conductors is an energizing conductor and at least one of said conductors is a grounding conductor, whereby said LC noise filter constitutes a normal mode LC noise filter.

3. An LC noise filter according to claim 1, wherein a first plurality of said conductors are energizing conductors and a second plurality of said conductors are shield conductors, at least one of said shield conductors being disposed so as to separate any two of said energizing conductors whereby said LC noise filter constitutes a common mode LC noise filter.

4. An LC noise filter according to claim 1, wherein said dielectric material is used as a substrate;
said plurality of spiral grooves are provided in at least one surface of said substrate in such a manner as to be concentrically adjacent to each other; and
at least one of said inductor conductors is provided in each of said grooves.

5. An LC noise filter according to claim 4, further comprising: a through hole provided at the center of said substrate; and a magnetic material surrounding said substrate for forming a magnetic path on the surface of said substrate.

6. An LC noise filter according to claim 4, wherein at least one of said conductors is an energizing conductor and at least one of said conductors is a grounding conductor, whereby said LC noise filter constitutes a normal mode LC noise filter.

7. An LC noise filter according to claim 4, wherein a first plurality of said conductors are energizing conductors and a second plurality of said conductors are shield conductors, at least one of said shield conductors separating any two of said energizing conductors whereby said LC noise filter constitutes a common mode LC noise filter.

8. An LC noise filter according to claim 1, wherein said dielectric material is formed into a thick substrate;
said plurality of spiral grooves are formed in said substrate as deep grooves; and
at least one of said inductor conductors is provided in each of said deep spiral grooves in such a manner as to be opposed to each other with said wall body therebetween.

9. An LC noise filter according to claim 8, wherein each of said spiral grooves is formed into a deep groove which penetrates through said substrate from said at least one surface to a back surface thereof.

10. A multi-channel noise filter comprising:
a substrate made of a dielectric material; and
a plurality of LC noise filters arranged adjacently to each other on said substrate;
each of said LC noise filters including:
a plurality of spiral grooves provided in at least one surface of said substrate in such a manner as to be concentrically adjacent to each other; and
a plurality of inductor conductors at least one of which is provided in each of said grooves;
each of said inductor conductors forming a capacitor with the inductor conductor adjacent thereto with a wall body of said dielectric material therebetween.

11. An LC noise filter comprising:
a dielectric material;
a spiral groove provided in at least one surface of said dielectric material; and
at least one ground groove provided in at least one surface of said dielectric material in such a manner as to be adjacent to a part of said spiral groove;
an inductor conductor provided in said spiral groove;
a grounding block conductor provided in said ground groove;
said inductor conductor forming a capacitor with the grounding block conductor adjacent thereto with a wall body of said dielectric material therebetween.

12. An LC noise filter according to claim 11, wherein said inductor conductor provided in said spiral groove is used as an energizing inductor conductor and constitutes a normal mode LC noise filter together with said grounding block conductor provided in said ground groove.

13. An LC noise filter according to claim 11, wherein at least two spiral grooves are provided in such a manner as to be concentrically adjacent to each other as said spiral groove, and energizing inductor conductors each of which is provided in each of said spiral grooves together with said grounding block conductor provided in said ground groove constitute a common mode LC noise filter.

14. An LC noise filter according to claim 11, wherein a plurality of said grounding block conductors are provided, and one of said grounding block conductors is disposed in proximity to an input or output terminal of said inductor conductor.

15. An LC noise filter according to claim 11, wherein said grounding block conductor includes a first block conductor disposed in proximity to an input terminal of said inductor conductor and a second block conductor disposed in proximity to an output terminal of said inductor conductor.

16. An LC noise filter according to claim 15, wherein said grounding block conductor includes a plurality of third block conductors disposed in such a manner as to be adjacent to a part of said inductor conductor between the input terminal and the output terminal of said inductor conductor.

17. An LC noise filter according to claim 11, wherein a plurality of grounding block conductors are intermittently provided between proximate lines of said inductor conductor so as to function as a shield conductor for preventing short circuit between the lines of said inductor conductor.

18. An LC noise filter according to claim 11, wherein said dielectric material forms a substrate;
said spiral groove and said ground groove are provided in at least one surface of said substrate in such a manner as to be adjacent to each other; and
said inductor conductor and said grounding block conductor are provided in each of said spiral groove and said ground groove, respectively.

19. An LC noise filter according to claim 11, wherein said dielectric is formed into a thick substrate; and
said spiral groove is formed in said substrate as a deep groove.

20. An LC noise filter according to claim 18, wherein said spiral groove is formed into a deep groove which penetrates through said substrate from said at least one surface to a back surface thereof.

21. An LC noise filter according claim 11, further comprising: a through hole situated at the center of said spiral groove in said substrate; and a magnetic material surrounding said substrate so as to form a magnetic path on the surface of said substrate.

22. A multi-channel noise filter comprising:

a substrate made of a dielectric material; and a plurality of LC noise filters arranged adjacently to each other on said substrate;

each of said LC noise filters including:

a spiral groove provided in at least one surface of said substrate;

at least one ground groove provided in at least one surface of said dielectric in such a manner as to be adjacent to a part of said spiral groove;

an inductor conductor provided in said spiral groove; and a grounding block conductor provided in said ground groove;

said inductor conductor forming a capacitor with a grounding block conductor adjacent thereto with a wall body of said dielectric material therebetween.

23. An Lc noise filter comprising:

an insulating substrate;

a spiral inductor conductor provided on at least one surface of said substrate; and at least one grounding block conductor provided on at least one surface of said substrate in such a manner as to be adjacent to and on a same surface as a part of said inductor conductor;

said inductor conductor forming a capacitor with the grounding block conductor adjacent thereto.

* * * * *